United States Patent
Goto et al.

(10) Patent No.: US 8,019,487 B2
(45) Date of Patent: Sep. 13, 2011

(54) VEHICLE CONTROL SYSTEM HAVING A COMPUTER INTEGRATED WITH A REWRITABLE AND NONVOLATILE MEMORY

(75) Inventors: Takahiro Goto, Ichinomiya (JP); Hirokazu Komori, Okazaki (JP)

(73) Assignee: Denso Corporation, Kariya (JP)

( * ) Notice: Subject to any disclaimer, the term of this patent is extended or adjusted under 35 U.S.C. 154(b) by 1226 days.

(21) Appl. No.: 11/593,049

(22) Filed: Nov. 6, 2006

(65) Prior Publication Data

US 2007/0106430 A1    May 10, 2007

(30) Foreign Application Priority Data

Nov. 4, 2005   (JP) ................. 2005-320911

(51) Int. Cl.
*G05D 1/00* (2006.01)
*G05D 3/00* (2006.01)
*G05F 7/00* (2006.01)
*G06F 17/00* (2006.01)

(52) U.S. Cl. ............... 701/1; 701/24; 701/33; 701/115

(58) Field of Classification Search ............... 701/1, 24, 701/33, 115; 713/1, 2; 710/22, 62, 74, 308; 711/166, 170, 152, 169; 73/116, 118.1, 117.3
See application file for complete search history.

(56) References Cited

U.S. PATENT DOCUMENTS

| | | | | |
|---|---|---|---|---|
| 5,473,540 A | * | 12/1995 | Schmitz | 701/1 |
| 5,694,538 A | * | 12/1997 | Okazaki et al. | 714/15 |
| 5,828,869 A | * | 10/1998 | Johnson et al. | 713/501 |
| 6,182,004 B1 | * | 1/2001 | Komori | 701/114 |
| 6,622,200 B1 | * | 9/2003 | Hasbun et al. | 711/103 |
| 6,700,479 B2 | * | 3/2004 | Birchfield | 340/426.14 |
| 6,766,448 B2 | * | 7/2004 | Kubota | 713/2 |
| 6,883,060 B1 | * | 4/2005 | Hayama | 711/103 |
| 2003/0058083 A1 | * | 3/2003 | Birchfield | 340/5.22 |
| 2003/0084431 A1 | * | 5/2003 | Kobayashi | 717/146 |
| 2003/0189860 A1 | * | 10/2003 | Takeuchi et al. | 365/200 |
| 2004/0019416 A1 | | 1/2004 | Chen et al. | |

(Continued)

FOREIGN PATENT DOCUMENTS

DE    4128922    3/1992

(Continued)

OTHER PUBLICATIONS

Office Action (8 pgs.) dated Apr. 4, 2011 issued in corresponding German Application No. 10 2006 051 974.4-56 with an at least partial English-language translation thereof (8 pgs.).

(Continued)

*Primary Examiner* — Khoi Tran
*Assistant Examiner* — Jorge Peche
(74) *Attorney, Agent, or Firm* — Nixon & Vanderhye P.C.

(57) ABSTRACT

A vehicle control system is installed in a vehicle. The vehicle control system includes a computer integrated with a first nonvolatile memory that is rewritable. The vehicle control system includes a second nonvolatile memory. The second nonvolatile memory stores therein software. The software allows the computer to execute an at least part of vehicle control. The vehicle control system also includes a writing unit accessible to the first and second nonvolatile memories. The writing unit reads out the software stored in the second nonvolatile memory at a given time. The writing unit writes the readout software into the first nonvolatile memory.

1 Claim, 10 Drawing Sheets

U.S. PATENT DOCUMENTS

| | | | |
|---|---|---|---|
| 2004/0088473 A1* | 5/2004 | Ogle | 711/100 |
| 2005/0013154 A1* | 1/2005 | Honda et al. | 365/145 |
| 2005/0224862 A1 | 10/2005 | Iino et al. | |
| 2006/0218340 A1* | 9/2006 | Fujita et al. | 711/103 |
| 2007/0050105 A1* | 3/2007 | Chinnadurai et al. | 701/29 |
| 2008/0117682 A1* | 5/2008 | Byeon | 365/185.18 |
| 2009/0307454 A1* | 12/2009 | Moessner et al. | 711/170 |

FOREIGN PATENT DOCUMENTS

| | | |
|---|---|---|
| DE | 4223398 | 1/1994 |
| EP | 1 313 011 | 5/2003 |
| JP | 4-246730 | 9/1992 |
| JP | 5-038969 | 2/1993 |
| JP | 8-319880 | 12/1996 |
| JP | 11-7381 | 1/1999 |
| JP | 11-296364 | 10/1999 |
| JP | 2001-138838 | 5/2001 |
| JP | 2001-195261 | 7/2001 |
| JP | 2004-48353 | 2/2004 |
| JP | 2004-58981 | 2/2004 |
| JP | 2005-302872 | 10/2005 |

OTHER PUBLICATIONS

Office Action dated Sep. 14, 2010 in corresponding Japanese Application No. 2005-320911 with an at least partial English-language translation thereof.

* cited by examiner

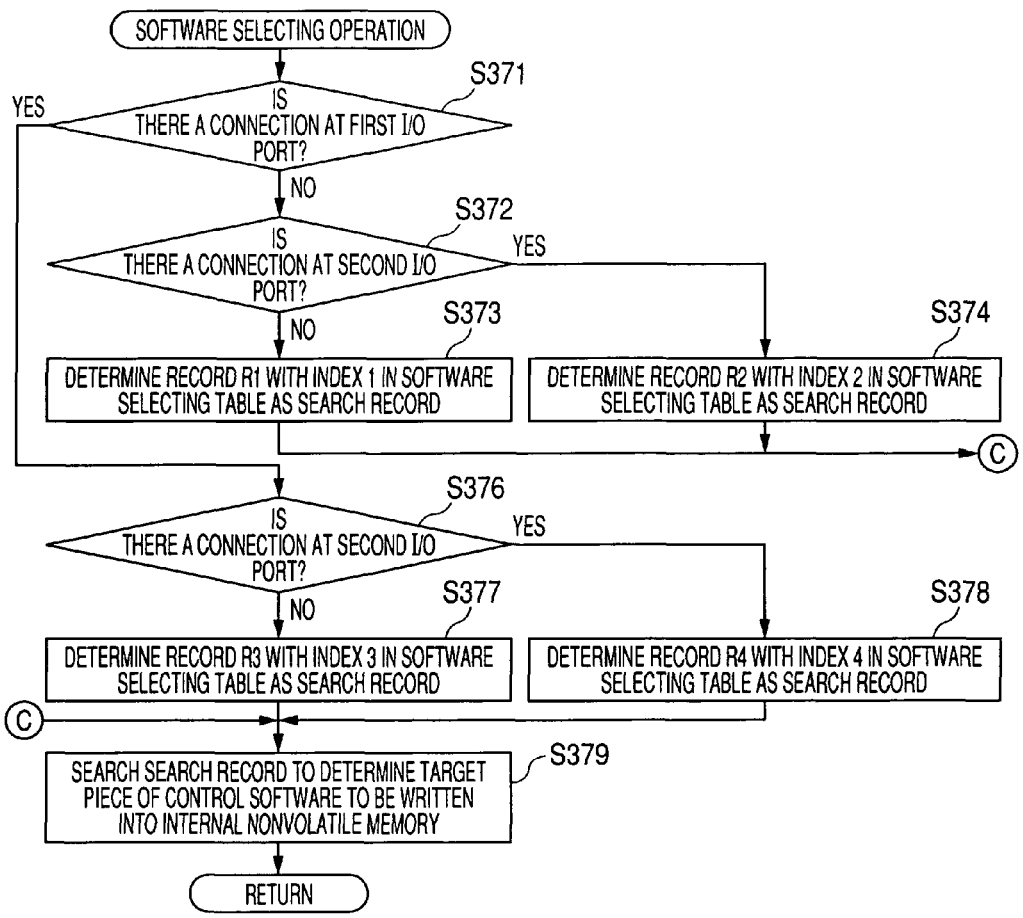
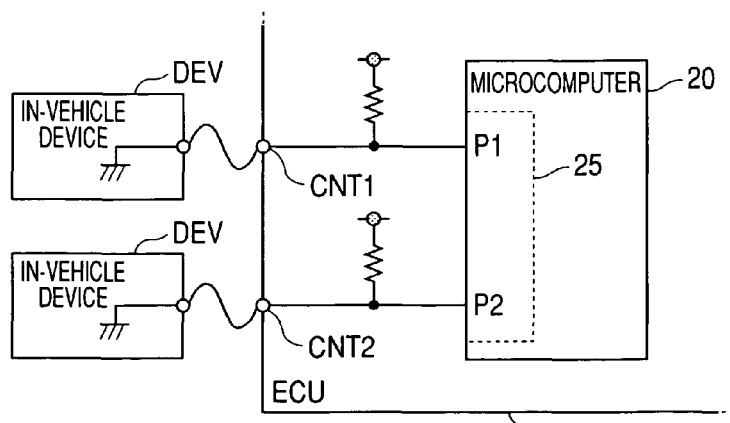

VEHICLE CONTROL SYSTEM HAVING A COMPUTER INTEGRATED WITH A REWRITABLE AND NONVOLATILE MEMORY

CROSS REFERENCE TO RELATED APPLICATION

This application is based on Japanese Patent Application 2005-320911 filed on Nov. 4, 2005. The descriptions of the Patent Application are therefore all incorporated herein by reference.

BACKGROUND OF THE INVENTION

1. Field of the Invention

The present invention relates to techniques for easily writing pieces of software into a rewritable and nonvolatile memory with which an in-vehicle computer is integrated.

2. Description of the Related Art

Electronic control units (ECUs) installing therein a microcomputer have been widely used for vehicle control in various ways. In vehicles in which such an ECU is installed beforehand, the microcomputer is operative to execute vehicle control in accordance with software stored in advance in a memory. In such a software controlled vehicle, a nonvolatile memory is used to store therein a piece of software that corresponds to the type of the software-controlled vehicle. This allows ECUs to accept various types of vehicles without changing the hardware structures of the ECUs.

Particularly, different types, such as different grades, of automobiles respectively install therein corresponding different types of ECUs. Moreover, there are various types of ECUs at least one of which a user optionally can select to thereby install the selected ECU in a user's own automobile. In addition, default values in a map (data table), which is used to control the engine, stored in advance in a memory of an ECU installed in a vehicle must be rewritten into values corresponding to the type of the vehicle.

These circumstances set force above have advances the adoption of an electrically rewritable memory for storing a piece of software.

The adoption of electrically rewritable memory allows a piece of software corresponding to the type of a vehicle to be written in the electrically rewritable memory at vehicle production lines and/or service centers for maintenance of vehicle. This permits ECUs to meet various types of vehicles. It is to be noted that ECUs with a microcomputer integrated with an electrically rewritable and nonvolatile memory have been well known.

An example of ways for changing vehicle control design is disclosed in Japanese Unexamined Patent Publication No. H05-38969.

In one typical example disclosed in the Patent Publication, a memory card is prepared as an example of removable external storage devices for microcomputers, and a piece of software created based on new vehicle design concept is written into the prepared memory card.

Next, the memory card is inserted into a card slot of the microcomputer. The microcomputer is programmed to load the piece of software stored in the memory card into a RAM of the microcomputer, making it possible to freely change the design of vehicle control to be executed by an ECU.

An ECU, which is disclosed in the Patent Publication and designed to load a piece of software from a RAM of the microcomputer to thereby execute vehicle control, has an advantage capable of easily using a removable external memory device. This makes it easy to change and/or update the piece of software installed in the ECU. The RAM however loses the piece of software stored therein when power to be supplied to the RAM is switched off. For this reason, during boot-up, the ECU (microcomputer) disclosed in the Patent Publication need load the piece of software stored in an external storage device, which may take a lot of time to boot up the ECU (microcomputer).

On the other hand, an ECU integrated with electrically rewritable and nonvolatile memory need not load a piece of software stored in an external storage device during boot-up, which makes it possible to boot up the ECU at high speed.

In rewriting of a piece of software stored in the electrically rewritable and nonvolatile memory, however, a tool designed specifically for the rewriting of the piece of software stored in the electrically rewritable and nonvolatile memory is required. This may make it difficult to easily rewrite a piece of software stored in the electrically rewritable and nonvolatile memory.

Specifically, if an ECU with an electrically rewritable and nonvolatile memory is installed in a vehicle, in order to easily rewrite a piece of software stored in the electrically rewritable and nonvolatile memory of the ECU, various pieces of software corresponding to a plurality of types of vehicles and the tool designed specifically for the software rewriting need be provided at each of service centers. This may increase the cost required to improve the level of convenience in rewriting of a piece of software stored in the electrically rewritable and nonvolatile memory.

In addition, when an ECU with an electrically rewritable and nonvolatile memory is installed in a vehicle, volatilization of a part of a piece of software stored in the electrically rewritable and nonvolatile memory may take a lot of time to repair the ECU (vehicle). This is because no pieces of software are prepared at each of service centers, auto-repair shops, and other similar shops.

SUMMARY OF THE INVENTION

In view of the background, an object of at least one aspect of the present invention is to provide vehicle control systems, which are capable of easily writing a piece of software into a rewritable and nonvolatile memory with which an in-vehicle computer is integrated.

According to a first aspect of the present invention, there is provided a vehicle control system installed in a vehicle and including a computer integrated with a first nonvolatile memory that is rewritable. The vehicle control system includes a second nonvolatile memory storing therein software. The software allows the computer to execute an at least part of vehicle control. The vehicle control system also includes a writing unit accessible to the first and second nonvolatile memories. The writing unit is configured to read out the software from the second nonvolatile memory at a given time, and to write the readout software into the first nonvolatile memory.

According to a second aspect of the present invention, there is provided a program product embedded in a media accessible by a computer installed in a vehicle and integrated with a first nonvolatile memory that is rewritable, in which a second nonvolatile memory accessible by the computer stores therein software. The software allows the computer to execute an at least part of vehicle control. The program product includes first means for instructing a computer accessible to the second nonvolatile memory to read out the software therefrom at a given time. The program product also includes second means for instructing a computer accessible to the first nonvolatile memory to write the readout software into the first nonvolatile memory.

BRIEF DESCRIPTION OF THE DRAWINGS

Other objects and aspects of the invention will become apparent from the following description of an embodiment with reference to the accompanying drawings in which:

FIG. 9 is a flowchart schematically illustrating a subroutine for a software selecting operation in step S370 of FIG. 8 to be executed by at least one ECU according to the second embodiment;

FIG. 10 is a view schematically illustrating a connection relationship between in-vehicle devices and each of first and second I/O ports of at least one ECU according to the second embodiment;

DETAILED DESCRIPTION OF EMBODIMENTS OF THE INVENTION

Embodiments of the present invention will be described hereinafter with reference to the attached figures.

First Embodiment

Figure 1:
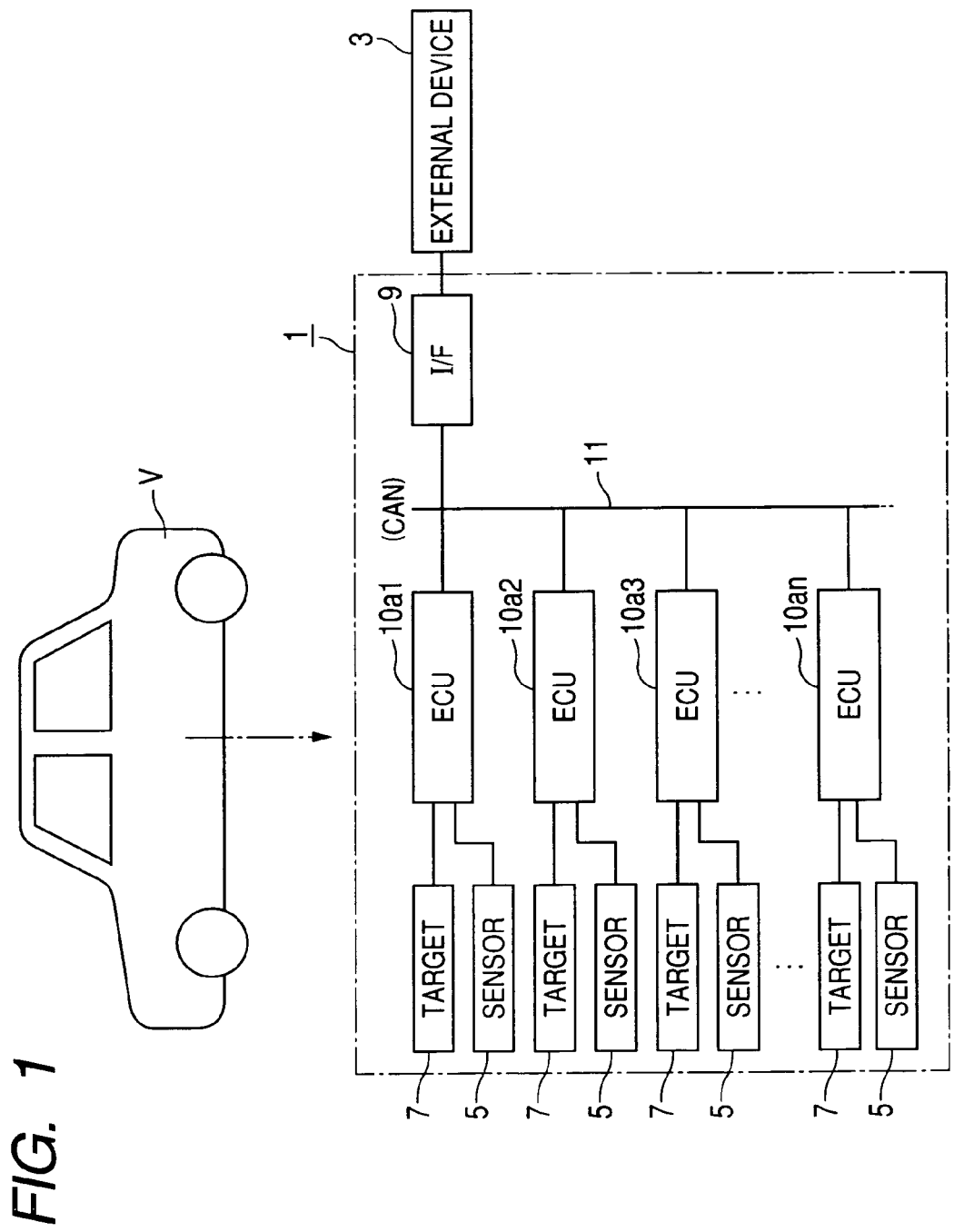
FIG. 1 is a block diagram schematically illustrating an example of the structure of a vehicle control system according to a first embodiment of the present invention.

Referring to FIG. 1, there is illustrated a vehicle control system 1 installed in, for example, a vehicle V and provided with a plurality of electronic control units (ECU) 10 according to a first embodiment of the present invention.

The vehicle control system 1 is provided with a CAN (Controller Area Network) 11 as an example of multiple networks. The plurality of ECUs 10 are communicably linked to each other through the CAN 11. Each of the ECUs 10 is electrically connected to corresponding in-vehicle devices, such as sensors 5 and control-target devices 7, such as actuators, which are installed in the vehicle V.

Each of the ECUs 10 is operative to:

periodically monitor measurands output from the corresponding sensors 5; and control the corresponding control-target devices 7 based on the periodically monitored measurands and data input, through the CAN 11, from another ECU and corresponding to the measurands measured by another to thereby implementing vehicle control.

For example, in the first embodiment, the vehicle control includes:

power train control containing engine control and transmission control and required to optimally drive the engine;

driving control containing brake control and required to highly maintain the driving performance, the steering stability, and the driving comfort of the vehicle V;

body control containing air-conditioner control and required to highly maintain the safety and the comfort of the vehicle V; and communication control containing navigation control and required to give various items of information to occupants in the vehicle V.

Specifically, in the first embodiment, the ECUs 10 include an engine-control ECU 10a1 electrically connected to various sensors 5 including an accelerator position sensor, a vehicle speed sensor, and an acceleration sensor, which are required to engine control, and connected to corresponding actuators 7 required to engine control.

The ECUs 10 include a transmission-control ECU 10a2 electrically connected to various sensors 5 required to control a transmission system installed in the vehicle V, and connected to corresponding actuators 7 required to control the transmission system.

The ECUs 10 include a brake-control ECU 10a3 electrically connected to various sensors 5 required to control a brake system installed in the vehicle V, and connected to corresponding actuators 7 required to control the brake system;

The ECUs 10 include an air-conditioner control ECU 10a4 electrically connected to various sensors 5 required to control an air-conditioner installed in the vehicle V, and connected to corresponding actuators 7 including a compressor of the air-conditioner required to control the air conditioner.

The ECUs 10 include a body-control ECU 10a5 electrically connected to control-target devices 7, such as meters and indicator lamps installed in an instrument panel of the vehicle V, and operative to control them. In addition, the body-control ECU is electrically connected to control-target devices 7 for controlling opening and closing of power windows of the vehicle V, and for controlling lock and unlock of doors of the vehicle V. At least one of the indicator lamps installed in the instrument panel is configured to illuminate warning light to prompt a driver to bring the vehicle to a halt.

The ECUs 10 include a navigation ECU 10a6. The navigation ECU 10a6 is electrically connected to various sensors 5 including a position finding sensor, such as a GPS (Global Positioning System) receiver, required to obtain at least one best route to the driver's destination. The navigation ECU 10a6 is also electrically connected to corresponding actuators 7, such as a monitor, required to display at least one of the obtained routes on a corresponding map.

The vehicle control system 1 is provided with an interface (I/F) 9 that allows an external device 3 to be removably linked to the CAN 11. The external device 3 consists of a computer-implemented communication device. The external device 3 is operative to establish a connection to each ECU 10 via the CAN 11 and to communicate with each ECU 10 for diagnosis monitoring of each ECU 10 and for rewriting pieces of software installed in each ECU 10.

Next, an example of the structure of each ECU 10 will be described in detail hereinafter.

Figure 2:
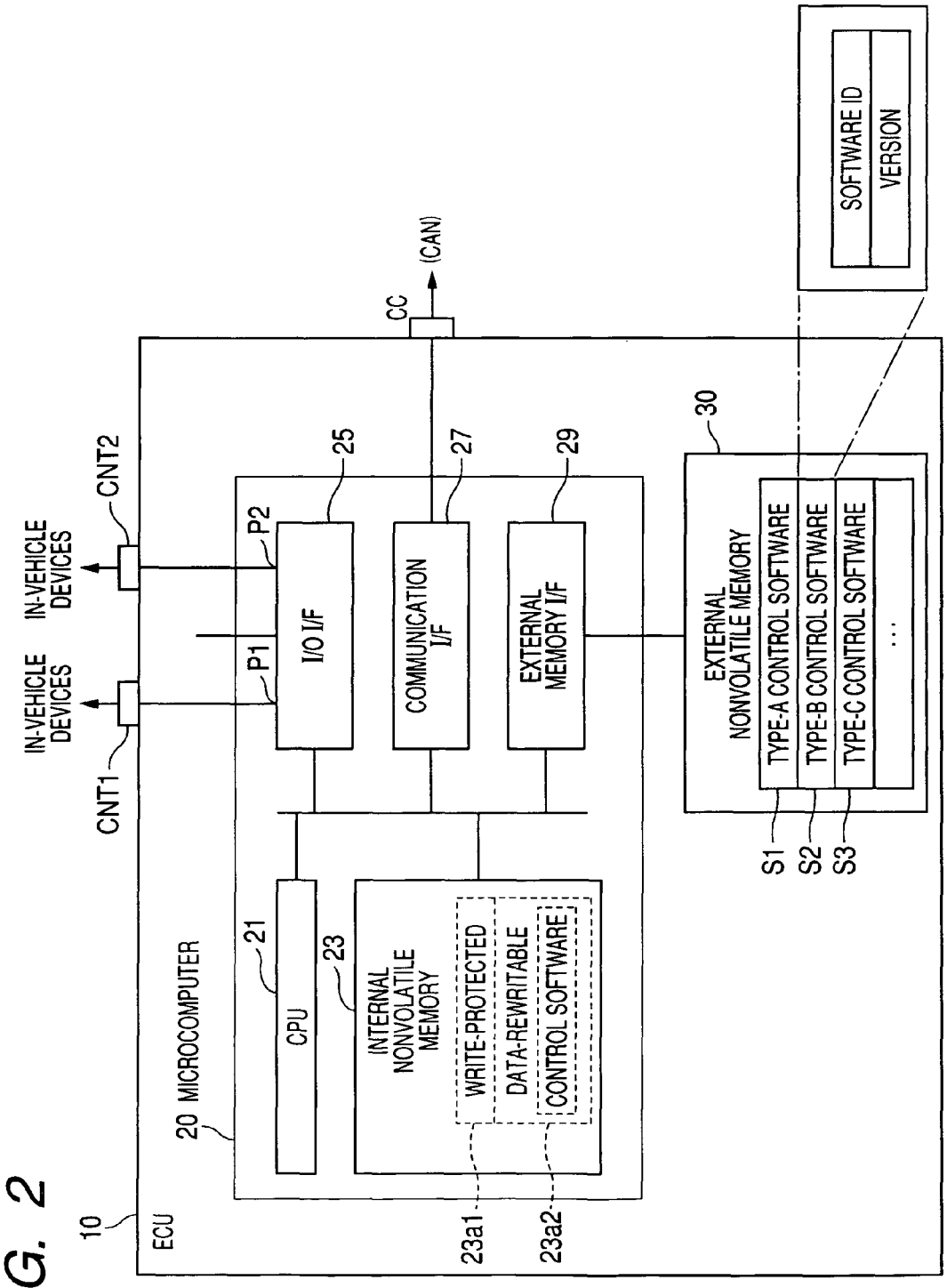
FIG. 2 is a block diagram schematically illustrating an example of the structure of each ECU of the vehicle control system illustrated in FIG. 1.

Referring to FIG. 2, each of the ECUs 10 includes a microcomputer 20 integrated with a first nonvolatile memory 23, and a second nonvolatile memory 30 electrically connected to the microcomputer 20.

The first nonvolatile memory 23, referred hereinafter to as "internal nonvolatile memory", consists essentially of an electrically rewritable NOR flash memory. The second nonvolatile memory 30, referred hereinafter to as "external nonvolatile memory", consists essentially of an electrically rewritable NAND flash memory, which allows the storage capacity of the external nonvolatile memory 30 to be larger than that of the internal nonvolatile memory 23.

The electrically rewritable NOR flash memory 23 provides the CPU 21 with a random high-speed access thereto, which is faster than an access rate of the CPU 21 to the external nonvolatile memory 30.

In addition to the internal nonvolatile memory 23, the microcomputer 20 of each ECU 10 consists essentially of a CPU 21, an input/output (I/O) interface 25, a communication interface (I/F) 27, and an external memory interface 29. The components 21, 23, 25, 27, and 29 of each ECU 10 are communicably coupled to each other via a bus B.

The CPU 21 is operative to carry out various tasks allocated for each ECU 10.

The input/output (I/O) interface 25 has at least first and second I/O ports P1 and P2, and the at least first and second I/O ports P1 and P2 are electrically connected respectively to at least first and second connectors CNT1 and CNT2 of each ECU 10.

The I/O interface 25 allows electrical connections between the CPU 21 and the corresponding sensors 5 and control-target devices 7 of each ECU 10.

The communication interface (I/F) 27 is electrically connected to a communication connector CC of each ECU 10 and is operative to allow the CPU 21 to communicate with another ECU and the external device 3 therethrough.

Moreover, the external memory interface (I/F) 29 is electrically connected to the external nonvolatile memory 30, and is operative to allow the CPU 21 to communicate with the external nonvolatile memory 30 therethrough.

Each of the ECUs 10 according to the first embodiment is configured to meet a plurality of predetermined different types of vehicles. Specifically, the external nonvolatile memory 30 stores, at respective predetermined address fields therein, a plurality of pieces of control software beforehand.

Each of the plurality of pieces S1 to Sn (n is an integer more than 1) of computer software consists of a program code including a set of instructions for causing a computer to execute predetermined operations.

Specifically, the plurality of pieces S1 to Sn of control software for vehicles are designed to respectively meet the plurality of predetermined different types of vehicles. For example, the pieces S1, S2, and S3 of control software are respectively designed to meet types A, B, and C of vehicles.

Each piece of control software contains therein its version and a software ID (identification) uniquely indicative of its type.

Specifically, in the engine-control ECU 10a1, the external nonvolatile memory 30 stores beforehand a plurality of pieces of engine-control software designed to respectively meet a plurality of different types of vehicles. The pieces of engine-control software for example include a piece of engine-control software designed to meet the type of vehicles equipped with an auto air conditioner. Moreover, the pieces of engine-control software include a piece of engine-control software designed to meet another type of vehicles without installing therein an auto air conditioner.

Figure 3:
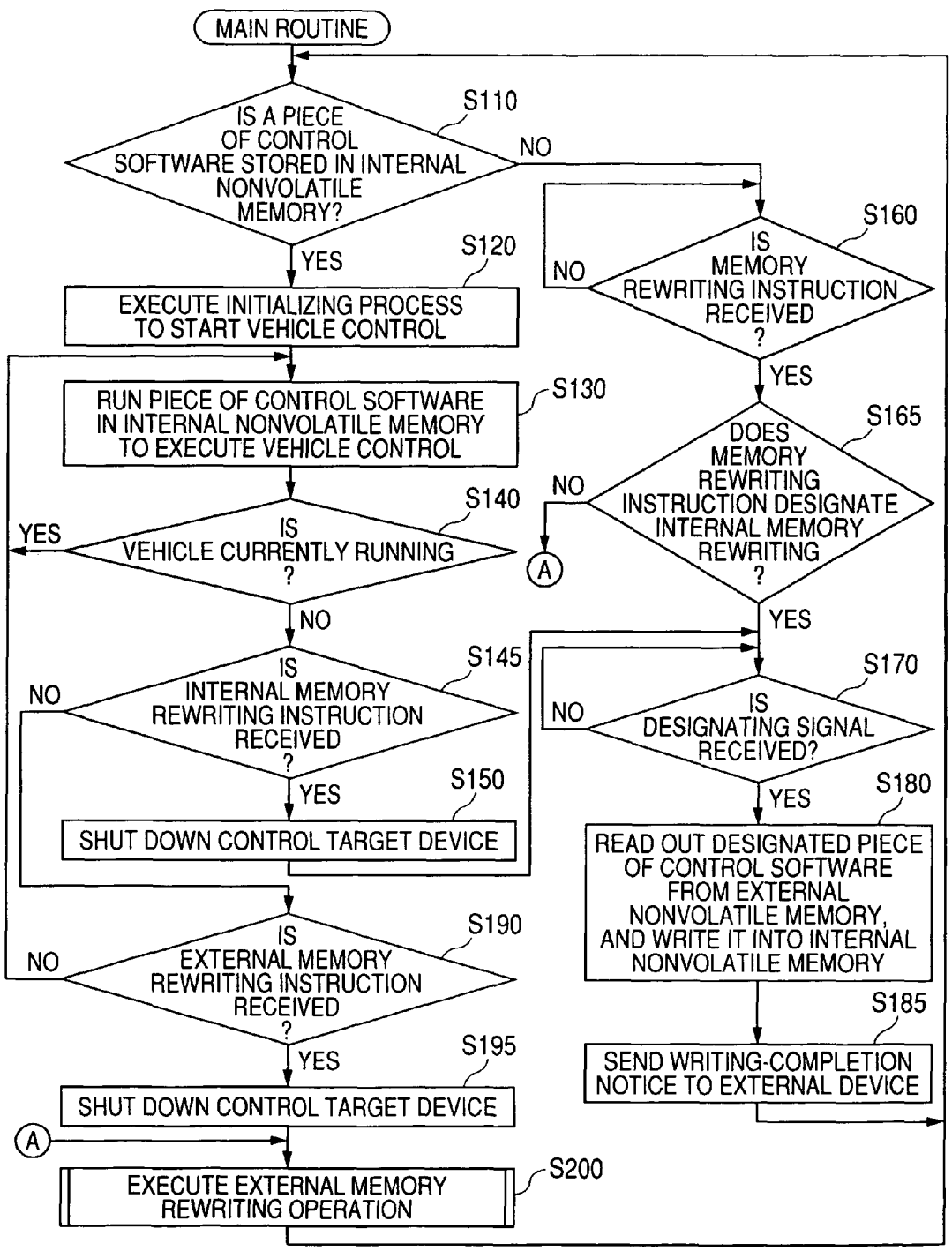
FIG. 3 is a flowchart schematically illustrating a main routine to be executed by at least one ECU illustrated in FIG. 2.

The internal nonvolatile memory 23 of each ECU 10 has a write-protected area 23a1 and a data-rewritable area 23a2. In at least one of the write-protected area 23a1 and the data-rewritable area 23a2, such as the write-protected area 23a1, main software is stored in advance. The main software allows the CPU 21 of each ECU 10 to perform a main routine corresponding each ECU 10, which is illustrated in FIG. 3.

The CPU 21 of each ECU 10 allows rewriting of one of the pieces of control software stored at a predetermined address field in the external nonvolatile memory 30 into the data-rewritable area 23a2.

Specifically, the microcomputer 20 (the CPU 21) of each ECU 10 is operative to carry out, in accordance with one of the pieces of control software stored in the data-rewritable area 23a2, the corresponding tasks allocated to each ECU 10 using:

the corresponding control-target devices 7 and the measurands detected by the corresponding sensors 5; and data equivalent to measurands to be measured by another ECU and input therefrom through the CAN 11 as need arises.

Next, the main routine to be executed by the CPU 21 of the microcomputer 20 of at least one ECU 10 in accordance with the main software stored in the write-protected area 23a1 will be described.

Referring to FIG. 3, when power is applied to at least one ECU 10, the CPU 21 of the at least one ECU 10 starts to run the main routine in accordance with the main software stored in the write-protected area 23a1.

In step S110 of the main routine, the CPU 21 determines whether a piece of control software is stored in the data-rewritable area 23a2 of the internal nonvolatile memory 23.

If it is determined that no pieces of software are stored in the data-rewritable area 23a2 so that the data-rewritable area 23a2 is empty, the determination in step S110 is NO. Then, the CPU 21 proceeds to step S160.

In step S160, the CPU 21 stands by for receiving a memory rewriting instruction from the external device 3 via the interface 9, the CAN 11, and the communication interface 27. Specifically, while no memory rewriting instructions are received from the external device 3 (the determination in step S160 is NO in FIG. 3), the CPU 21 continues to the standby.

In contrast, when receiving the memory rewriting instruction from the external device 3 via the interface 9, the CAN 11, and the communication interface 27 (the determination in step S160 is YES in FIG. 3), the CPU 21 determines whether the received memory rewriting instruction designates an internal memory rewriting in step S165.

It is to be noted that the memory rewriting instruction designates any one of internal memory rewriting and external memory rewriting in the first embodiment. In other words, as the memory rewriting instruction, both an internal memory rewriting instruction and an external memory rewriting instruction are used in the first embodiment.

If it is determined that the memory rewriting instruction does not designate internal memory rewriting (the determination in step S165 is NO), the CPU 21 proceeds to step S200, and executes an external memory rewriting operation in step S200, which will be described hereinafter and illustrated in FIG. 4. After completion of the external memory rewriting operation, the CPU 21 shifts to step S110.

Otherwise if it is determined that the memory rewriting instruction designates internal memory rewriting (the determination in step S165 is YES), the CPU 21 proceeds to step S170. In step S170, the CPU 21 stands by for receiving, through the communication interface 27, a signal designating, as a target piece of control software, one of the pieces of control software that will be sent from the external device 3. It is to be noted that the designation signal for example contains a software ID designating the target piece of control software stored in the external nonvolatile memory 30.

When receiving the designation signal being sent from the external device 3 (the determination in step S170 is YES), the CPU 21 shifts to step S180, and reads out, from the external nonvolatile memory 30, the target piece of control software corresponding to the software ID contained in the designation signal in step S180. In step S180, the CPU 21 further writes the readout target piece of control software into the data-rewritable area 23a2 of the internal nonvolatile memory 23.

After completion of the operation in step S180, the CPU 21 sends, through the communication interface 27 to the external device 3, a writing-completion notice representing that the successful completion of control-software writing in step S185. Thereafter, the CPU 21 shifts to step S110.

On the other hand, if it is determined that a piece of control software is stored in the data-rewritable area 23a2 (the determination in step S110 is YES), the CPU 21 proceeds to step S120.

In step S120, the CPU 21 executes an initializing process required to start the vehicle control. For example, as the initializing process, the CPU 21 initializes the corresponding control-target devices 7.

After the initializing process in step S120, the CPU 21 proceeds to step S130, and runs the piece of control software stored in the data-rewritable area 23a2 thereon. This allows the CPU 21 to execute an allocated part of the vehicle control based on the piece of control software.

Specifically, in step S130, the CPU 21 of the engine-control ECU 10a1 controls, in accordance with the piece of control software stored in the data-rewritable area 23a2, the corresponding actuators 7 based on the measurands monitored by the corresponding sensors 5, such as the accelerator position sensor to thereby control the engine.

It is to be noted that, when the piece of control software meets the type of vehicles equipped with an auto air conditioner, while executing the engine control, the CPU 21 of the engine-control ECU 10a1 controls the air-conditioner control ECU 10a4 based on acceleration and deceleration of the vehicle V periodically monitored by the acceleration sensor 5. Under control of the engine-control ECU 10a1, the CPU 21 of the air-conditioner control ECU 10a4 controls the width of each pulse in a pulsed drive voltage to be supplied to the compressor 7 to be changed based on acceleration and deceleration of the vehicle V. This allows the air-conditioning performance of the air-conditioner to be automatically controlled depending on acceleration and deceleration of the vehicle V.

After completion of the allocated part of the vehicle control based on the piece of control software at a given cycle, the CPU 21 proceeds to step S140, and determines whether the vehicle V is currently running based on the measurand currently monitored by the vehicle speed sensor 5 in step S140.

If it is determined that the vehicle V is currently running based on the measurand currently monitored by the vehicle speed sensor 5 (the determination in step S140 is YES), the CPU 21 returns to step S130 and repeatedly executes the vehicle control operations in steps S130 and S140 until the determination in step S140 is NO.

Otherwise if it is determined that the vehicle V is not currently running, in other words, the vehicle V is parked, the CPU 21 proceeds to step S145, and determines whether to receive the internal memory rewriting instruction in step S145.

If it is determined that the internal memory rewriting instruction is received (the determination in step S145 is YES), the CPU 21 proceeds to step S150. In step S150, the CPU 21 shuts down the allocated part of the vehicle control. For example, the CPU 21 shuts down the corresponding control-target devices 7.

After completion of the operation in step S150, the CPU 21 shifts to step S170, and stands by for receiving, through the communication interface 27, the designating signal designating, as a target piece of control software, one of the pieces of control software stored in the external device 3.

When receiving the designating signal being sent from the external device 3 (the determination in step S170 is YES), the CPU 21 shifts to step S180. In step S180, the CPU 21 reads out, from the external nonvolatile memory 30, the target piece of control software corresponding to the software ID contained in the designation signal.

Subsequently, in step S180, the CPU 21 overwrites, with the readout target piece of control software, the piece of software stored in the data-rewritable area 23a2 of the internal nonvolatile memory 23.

After completion of the operation in step S180, the CPU 21 executes the writing-completion notice operation in step S185, returning to step S110, and after completion of the operations in steps S110 and S120, the CPU 21 runs the target piece of control software stored in the data-rewritable area 23a2 thereon in step S130.

Otherwise if it is determined that no internal memory rewriting instructions are received (the determination in step S145 is NO), the CPU 21 proceeds to step S190.

In step S190, the CPU 21 determines whether to receive the external memory rewriting instruction via the communication interface 27 from the external device 3.

If it is determined that no external memory rewriting instructions are received (the determination in step S190 is NO), the CPU 21 shifts to step S130, and runs the piece of control software stored in the data-rewritable area 23a2 thereon.

Otherwise if it is determined that the external memory rewriting instruction is received (the determination in step S190 is YES), the CPU 21 shifts to step S195, and shuts down the allocated part of the vehicle control. For example, the CPU 21 shuts down the corresponding control-target devices 7.

After completion of the operation in step S195, the CPU 21 executes an external memory rewriting operation in step S200, and thereafter, the CPU 21 shifts to step S110.

Next, a subroutine for the external memory rewriting operation in step S200 to be executed by the CPU 21 will be described hereinafter with reference to FIG. 4.

In starting the external memory rewriting operation, the CPU 21 receives, through the communication interface 27, a piece of control software, as a target piece of control software, sent from the external device 3, and writes, into the external nonvolatile memory 30, the target piece of control software from its first instruction toward its last instruction in step S210.

In step S210, if a piece of control software whose software ID is identical to that of the target piece of software sent from the external device 3 is stored in the external nonvolatile memory 30, the CPU 21 can update the piece of control software that stored in the external nonvolatile memory 30 to the target piece of control software sent from the external device 3.

Otherwise if no pieces of control software whose software IDs are identical to that of the target piece of software sent from the external device 3 is stored in the external nonvolatile memory 30 in step S210, the CPU 21 additionally writes the target piece of control software sent from the external device 3 into the external nonvolatile memory 30.

Next, in step S220, the CPU 21 determines whether the writing of the target piece of control software is normally completed up to the final instruction thereof in step S220. In other words, the CPU 21 determines whether the last instruction of the target piece of control software is normally written in the external nonvolatile memory 30.

If it is determined that the writing of the target piece of control software is normally completed up to the final instruction thereof (the determination in step S220 is YES), the CPU 21 proceeds to step S230.

In step S230, the CPU 21 determines whether the currently written target piece of control software is:

identical in software ID to a piece of control software currently stored in the data-rewritable area 23a2 of the internal nonvolatile memory 23; and corresponding to a new version of the piece of control software currently stored in the data-rewritable area 23a2.

It is to be noted that, if no pieces of control software are stored in the data-rewritable area 23a2 of the internal nonvolatile memory 23, the determination in step S230 by the CPU 21 is negative.

In step S230, if it is determined that the currently written target piece of control software is identical in software ID to and is corresponding to a new version of the piece of control software currently stored in the data-rewritable area 23a2, (the determination in step S230 is affirmative), the CPU 21 proceeds to step S240.

In step S240, the CPU 21 reads out, from the external nonvolatile memory 30, the target piece of control software written therein in step S210. In addition, in step S240, the CPU 21 writes the readout target piece of control software into the data-rewritable area 23a2 of the internal nonvolatile memory 23.

In other words, in step S240, when reading out, from the external nonvolatile memory 30, the target piece of control software, the CPU 21 updates the piece of control software having an earlier version and a software ID and stored in the data-rewritable area 23a2 to the piece of control software having the new version and the same software ID.

After completion of the operation in step S240, the CPU 21 proceeds to step S250. In step S250, the CPU 21 sends, through the communication interface 27 to the external device 3, a writing-completion notice representing the successful completion of control-software writing. Thereafter, the CPU 21 exits the subroutine for the external memory rewriting operation, returning to S110 of the main routine.

Otherwise if it is determined that the currently written target piece of control software is nonidentical in software ID to and/or not corresponding to the piece of control software currently stored in the data-rewritable area 23a2 (the determination in step S230 is negative), the CPU 21 skips step S240, shifting to step S250.

In step S250, the CPU 21 sends, through the communication interface 27 to the external device 3, the writing-completion notice representing that the successful completion of control-software writing. Thereafter, the CPU 21 exits the subroutine for the external memory rewriting operation, returning to S110 of the main routine.

In step S220, if it is determined that the writing of the target piece of control software is abnormally completed before up to the final instruction thereof (the determination in step S220 is NO), the CPU 21 determines that the writing of the target piece of control software has been failed, proceeding to step S260.

In step S260, the CPU 21 determines whether the target piece of control software the writing of which has been failed is identical in software ID to a piece of software currently stored in the data-rewritable area 23a2 of the internal nonvolatile memory 23.

It is to be noted that the target piece of control software the writing of which has been failed will be referred to as "writing failed piece of control software". It is also to be noted that, if no pieces of control software are stored in the data-rewritable area 23a2 of the internal nonvolatile memory 23, the determination in step S260 by the CPU 21 is negative.

If it is determined that the writing failed piece of control software is identical in software ID to the piece of software currently stored in the data-rewritable area 23a2 of the internal nonvolatile memory 23 (the determination in step S260 is YES), the CPU 21 proceeds to step S270.

In step S270, the CPU 21 reads out, from the data-rewritable area 23a2 of the internal nonvolatile memory 23, the piece of control software whose software ID is identical to that of the writing failed piece of control software. Then, in step S270, the CPU 21 overwrites the writing failed piece of control software with the readout piece of control software that is identical in software ID to the writing failed piece of control software.

The operation in step S270 allows the piece of control software identical in software ID to the writing failed piece of control software to be recovered in the external nonvolatile memory 30. The operation in step S270 will be therefore referred to as "recovery operation".

Subsequently, in step S280, the CPU 21 sends, through the communication interface 27 to the external device 3, a writing failed notice representing the unsuccessful completion of control-software writing, and thereafter, the CPU 21 exits the subroutine for the external memory rewriting operation, returning to S110 of the main routine.

If it is determined that the writing failed piece of control software is nonidentical in software ID to the piece of software currently stored in the data-rewritable area 23a2 of the internal nonvolatile memory 23 (the determination in step S260 is NO), the CPU 21 skips step S270, shifting to step S280.

In step S280, the CPU 21 sends, through the communication interface 27 to the external device 3, a writing failed notice representing that writing of control software is unsuccessfully completed without execution of the recovery operation in step S270. Thereafter, the CPU 21 exits the subroutine for the external memory rewriting operation, returning to S110 of the main routine.

As described above, when receiving the internal memory rewriting instruction from the external device 3 (see steps S160 and S165 or step S145 in FIG. 3 and a reference character F1 in FIG. 5), at least one ECU 10 according to the first embodiment executes the control-software writing task into the internal nonvolatile memory 23.

Figure 5:
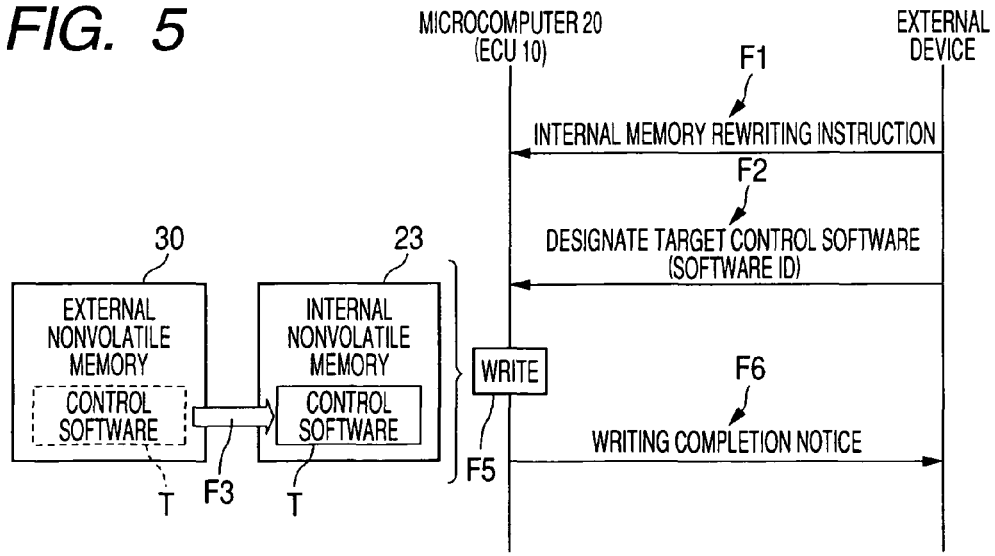
FIG. 5 is a signal flowchart schematically illustrating signal flows to be transferred between an external device and a microcomputer of at least one ECU according to the first embodiment.

Specifically, at least one ECU 10 reads out, from the external nonvolatile memory 30, a target piece T of control software whose software ID is designated by the designation signal sent from the external device (see step S180 in FIG. 3 and reference characters F2 and F3 in FIG. 5).

Next, at least one ECU 10 writes the readout target piece T of control software into the internal nonvolatile memory 23, thereby updating, to the readout target piece T of control software, a piece of control software stored in the internal nonvolatile memory 23 (see step S180 in FIG. 3 and a reference character F4 in FIG. 5). This allows the microcomputer 20 of at least one ECU 10 to execute the target piece T of control software designated by the external device 3. Thereafter, at least one ECU 10 sends, to the external device 3, a writing-completion notice representing that the successful completion of control-software writing (see step S185 in FIG. 3 and a reference character F6 in FIG. 5).

Accordingly, even if at least one ECU 10 is installed in the vehicle V with a predetermined type while no pieces of control software are installed in the microcomputer 20 thereof, writing of a piece of control software meeting the predetermined type of the vehicle V into the internal nonvolatile memory 23 allows the at least one ECU 10 to easily conform with the predetermined type of the vehicle V.

In addition, even if the predetermined type of the vehicle V is changed due to, for example, installation of an option(s) into the vehicle V, updating of the piece of control software currently stored in the internal nonvolatile memory 23 to a new piece of control software meeting the changed type of the vehicle V allows the at least one ECU 10 to easily conform with the changed type of the vehicle V.

Specifically, in the first embodiment, there is no necessity to transfer a proper piece of control software from the external device 3 to at least one ECU 10. This makes it possible to easily write, at vehicle production lines and/or service centers for maintenance of vehicles, the proper piece of control software into the microcomputer 20 of at least one ECU 10 even though no pieces of control software are prepared in advance at the vehicle production lines and/or service centers.

Moreover, because a piece of control software to be executed is written into the internal nonvolatile memory 23 to be stored therein, it is possible to boot up at least one ECU 10 faster than a conventional ECU in which, during booting-up, it is required to load a piece of control software from an exterior storage device, such as a memory card to a RAM of the conventional ECU.

Accordingly, at least one ECU 10 can be designed to easily boot up, and a piece of control software stored in the at least one ECU 10 can be easily updated.

In addition, when receiving the external memory rewriting instruction from the external device 3 (see steps S190 and S195 in FIG. 4 and a reference character F10 in FIG. 6), at least one ECU 10 according to the first embodiment executes the control-software writing task into the external nonvolatile memory 30.

Figure 4:
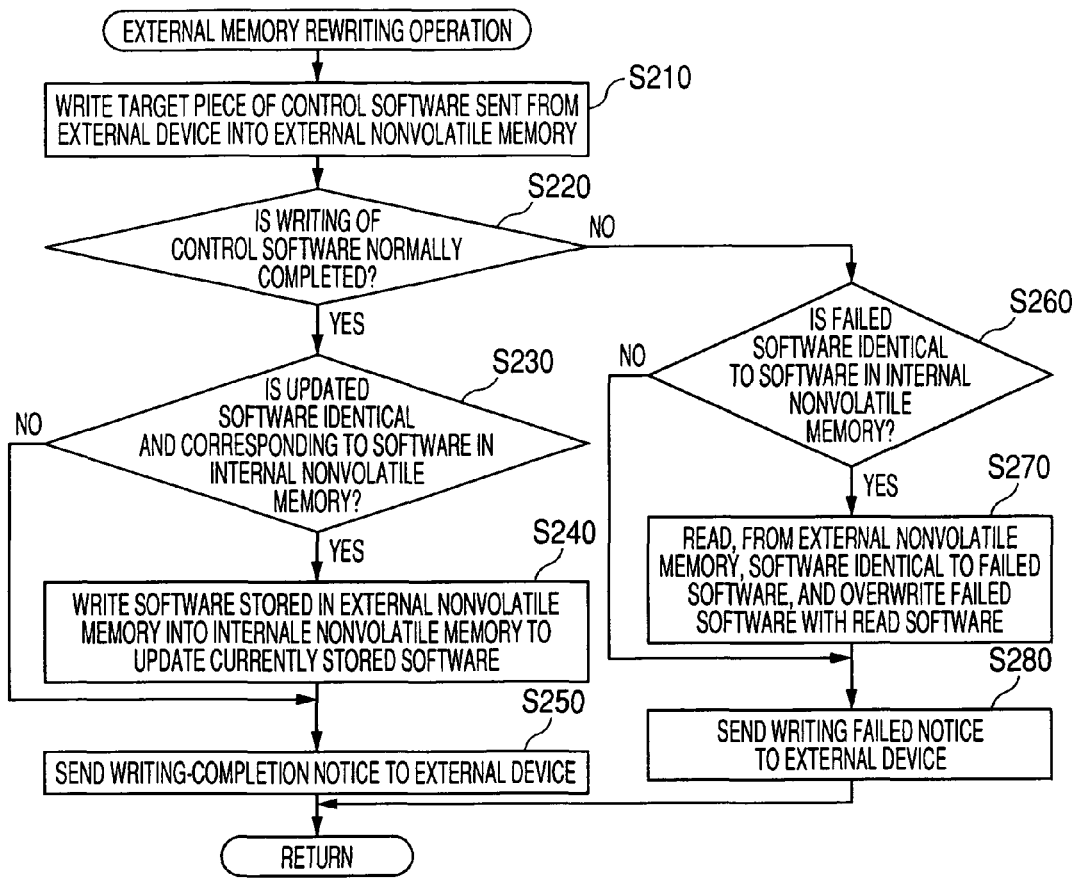
FIG. 4 is a flowchart schematically illustrating a subroutine for an external memory rewriting operation in step S200 of FIG. 3 to be executed by at least one ECU illustrated in FIG. 2.
Figure 6:
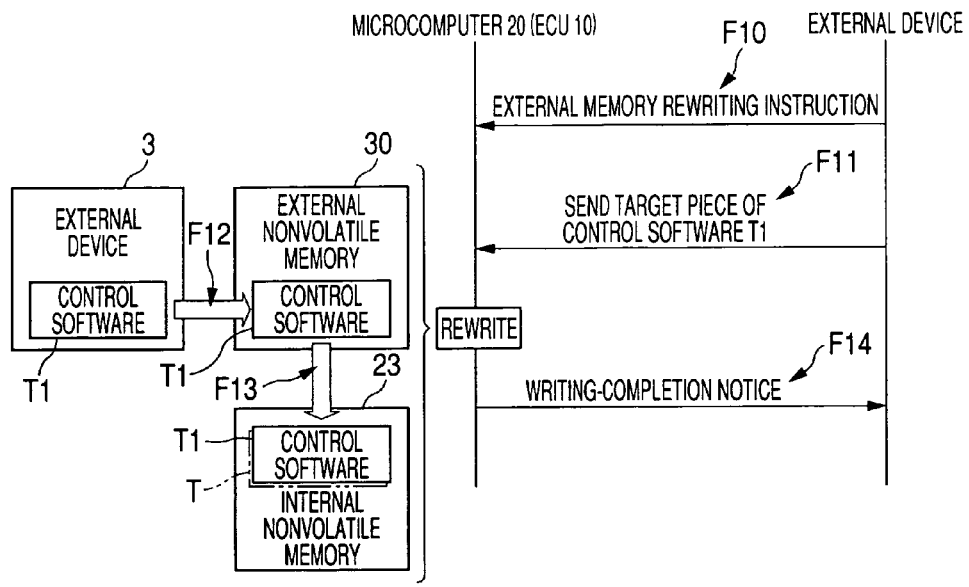
FIG. 6 is another signal flowchart schematically illustrating signal flows to be transferred between an external device and a microcomputer of at least one ECU according to the first embodiment.

Specifically, at least one ECU 10 writes, into the external nonvolatile memory 30, a target piece T1 of control software, which is sent from the external device 3, from its first instruction toward its last instruction (see steps S210 in FIG. 4 and reference characters F11 and F12 in FIG. 6).

After competition of the control-software writing, when the currently written target piece T1 of control software is identical in software ID to and is corresponding to a new version of the piece of control software T currently stored in the internal nonvolatile memory 23 (see "YES" in step S230 of FIG. 4), the CPU 21 reads out, from the external nonvolatile memory 30, the target piece T1 of control software.

Then, the CPU 21 writes the readout target piece T1 of control software into the internal nonvolatile memory 23. This allows updating of the target piece T of control software having an earlier version and a software ID and stored in the internal nonvolatile memory 23 to the target piece T1 of control software having the new version and the same software ID (see "YES" in step S230 and step S240 in FIG. 4 and a reference character F13 in FIG. 6). Thereafter, at least one ECU 10 sends, to the external device 3, a writing-completion notice representing that the successful completion of control-software writing (see step S185 in FIG. 3 and a reference character F14 in FIG. 6).

Accordingly, transfer, from the external device 3, of a piece of control software with the same software ID and a new version with respect to a piece of control software currently stored in the external device 3 allows the piece of control software with the new version to be easily written into both the internal and external nonvolatile memories 23 and 30.

In addition, during the writing of a target piece of control software stored in the external nonvolatile memory 30 into the internal nonvolatile memory 23, there is the possibility that a trouble, such as power-shutdown, arises so that the control-software writing is abnormally interrupted.

In the first embodiment, even if the trouble arises, retransmission of the same target piece of control software from the external nonvolatile memory 30 into the internal nonvolatile memory 23 allows the target piece of control software to be easily rewritten into the internal nonvolatile memory 23 without the need of transferring the target piece of control software to the internal nonvolatile memory 23.

Moreover, during the writing of a target piece of control software into the external nonvolatile memory 30 from the external device 3, there is the possibility that a trouble, such as power-shutdown, arises so that the control-software writing is abnormally interrupted (see step S210 and "NO" in step S220 of FIG. 4).

In the first embodiment, even though the trouble arises, it is possible to recover the piece of control software in the external nonvolatile memory 30 based on a piece of control software whose software ID is identical to the piece of control software. This allows the level of convenience in the vehicle control system 1 to be improved.

Second Embodiment

A vehicle control system according to a second embodiment of the present invention will be described hereinafter.

Like reference characters are assigned to like parts in the vehicle control systems according to the first and second embodiments. Descriptions of the parts of the vehicle control system according to the second embodiment will be therefore omitted, and different parts of the vehicle control system according to the second embodiment from that according to the first embodiment will be described in detail hereinafter.

The vehicle control system according to the second embodiment has:

a function of identifying the type of the vehicle V in which the vehicle control system is installed;

a function of selectively reading out at least one of pieces of control software from an external nonvolatile memory 30A, the at least one of pieces of control software meeting the type of the vehicle V; and a function of writing the readout at least one of pieces of control software into the internal nonvolatile memory 23.

Figure 7:
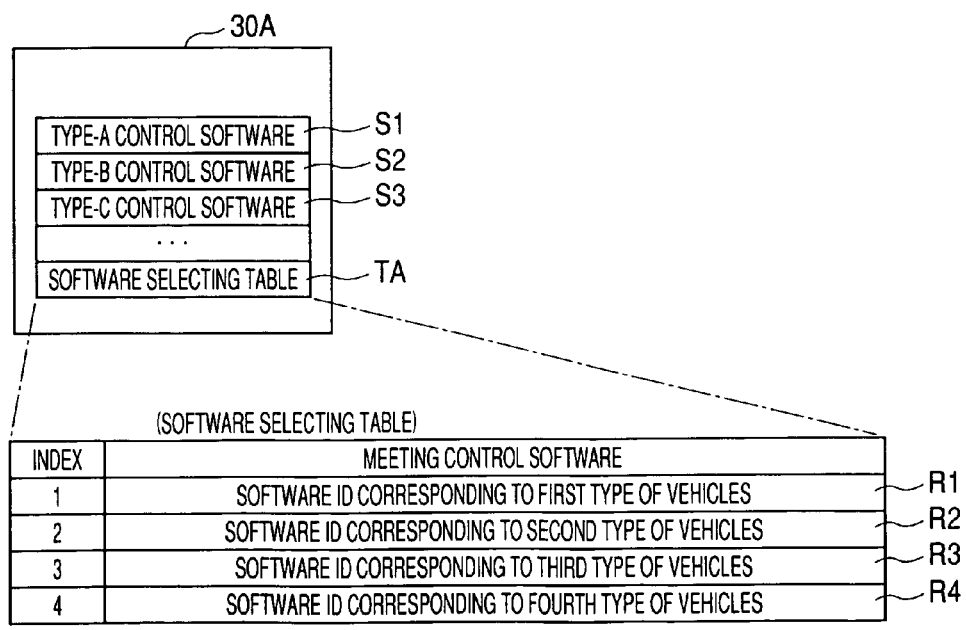
FIG. 7 is a view schematically illustrating an example of the structure of an external nonvolatile memory of a vehicle control system according to a second embodiment of the present invention.

FIG. 7 schematically illustrates an example of the structure of a software selecting table TA stored in advance in the external nonvolatile memory 30A. Specifically, each ECU 10 according to the second embodiment includes a plurality of pieces of control software S1 to Sn meeting respectively a plurality of different types of vehicles, and the software selecting table TA. The plurality of pieces of software S1 to Sn and the software selecting table TA are stored in the external nonvolatile memory 30A.

As illustrated in FIG. 7, the software selecting table TA consists essentially of a collection of records R1 to Rn (n is an integer greater than or equal to 2). The records R1 to Rn respectively correspond to the types of vehicles.

Specifically, each of the records R1 to Rn stores a software ID uniquely indicative of the type of a piece of control software, and an index associated with the software ID. The index allows each ECU 10 to find the corresponding software ID. The software selecting table TA is used for the microcomputer 20 of each ECU 10 to identify which piece(s) of control software meets the type of the vehicle V.

For example, in the second embodiment, the types of vehicles include:

a first type of vehicles in which no corresponding in-vehicle devices DEV, such as corresponding sensors 5 and/or corresponding control-target devices 7, are connected to the first and second I/O ports P1 and P2 via the first and second connectors CNT1 and CNT2;

a second type of vehicles in which no corresponding in-vehicle devices DEV are connected to the first I/O port P1 via the first connector CNT1, but at least one corresponding in-vehicle device DEV is connected to the second I/O port P2 via the second connector CNT2;

a third type of vehicles in which at least one corresponding in-vehicle device DEV is connected to the first I/O port P1 via the first connector CNT1, but no corresponding in-vehicle devices DEV are connected to the second I/O port P2 via the second connector CNT2; and a fourth type of vehicles in which corresponding in-vehicle devices DEV are connected to both the first and second I/O ports P1 and P2 via the first and second connectors CNT1 and CNT2.

The type of vehicle V in which the vehicle control system according to the second embodiment is installed is previously determined to any one of the first to fourth types of vehicles.

The record R1 with the index 1 in the software selecting table TA stores a software ID indicative of the type of at least one piece of control software meeting the first type of vehicles.

The record R2 with the index 2 in the software selecting table TA stores a software ID indicative of the type of at least one piece of control software meeting the second type of vehicles.

The record R3 with the index 3 in the software selecting table TA stores a software ID indicative of the type of at least one piece of control software meeting the third type of vehicles.

The record R4 with the index 4 in the software selecting table TA stores a software ID indicative of the type of at least one piece of control software meeting the fourth type of vehicles.

It is to be noted that which types of in-vehicle devices DEV (the sensors 5 and the control-target devices 7) is determined in advance.

In the second embodiment, in each piece of control software that meets types of vehicles in which at least one in-vehicle device DEV is connected to the first port P1 of the microcomputer 20 of each ECU 10, at least one first program is installed beforehand. The at least one first program is designed to instruct a microcomputer to execute an allocated part of vehicle control using the at least one in-vehicle device DEV.

Similarly, in each piece of control software that meets types of vehicles in which at least one in-vehicle device DEV is connected to the second port P2 of the microcomputer 20 of each ECU 10, at least one second program is installed beforehand. The at least one second program is designed to instruct a microcomputer to execute an allocated part of vehicle control using the at least one in-vehicle device DEV.

In the second embodiment, it is to be noted that the first I/O port P1 is constantly subjected to a high-level signal when no in-vehicle devices DEV1 are connected to the first I/O port P1. It is also to be noted that the second I/O port P2 is constantly subjected to a high-level signal when no in-vehicle devices DEV2 are connected to the second I/O port P2.

Next, a main routine to be executed by the CPU 21 of the microcomputer 20 of at least one ECU 10 according to the second embodiment in accordance with a main software stored in the internal nonvolatile memory 23 will be described.

Figure 8:
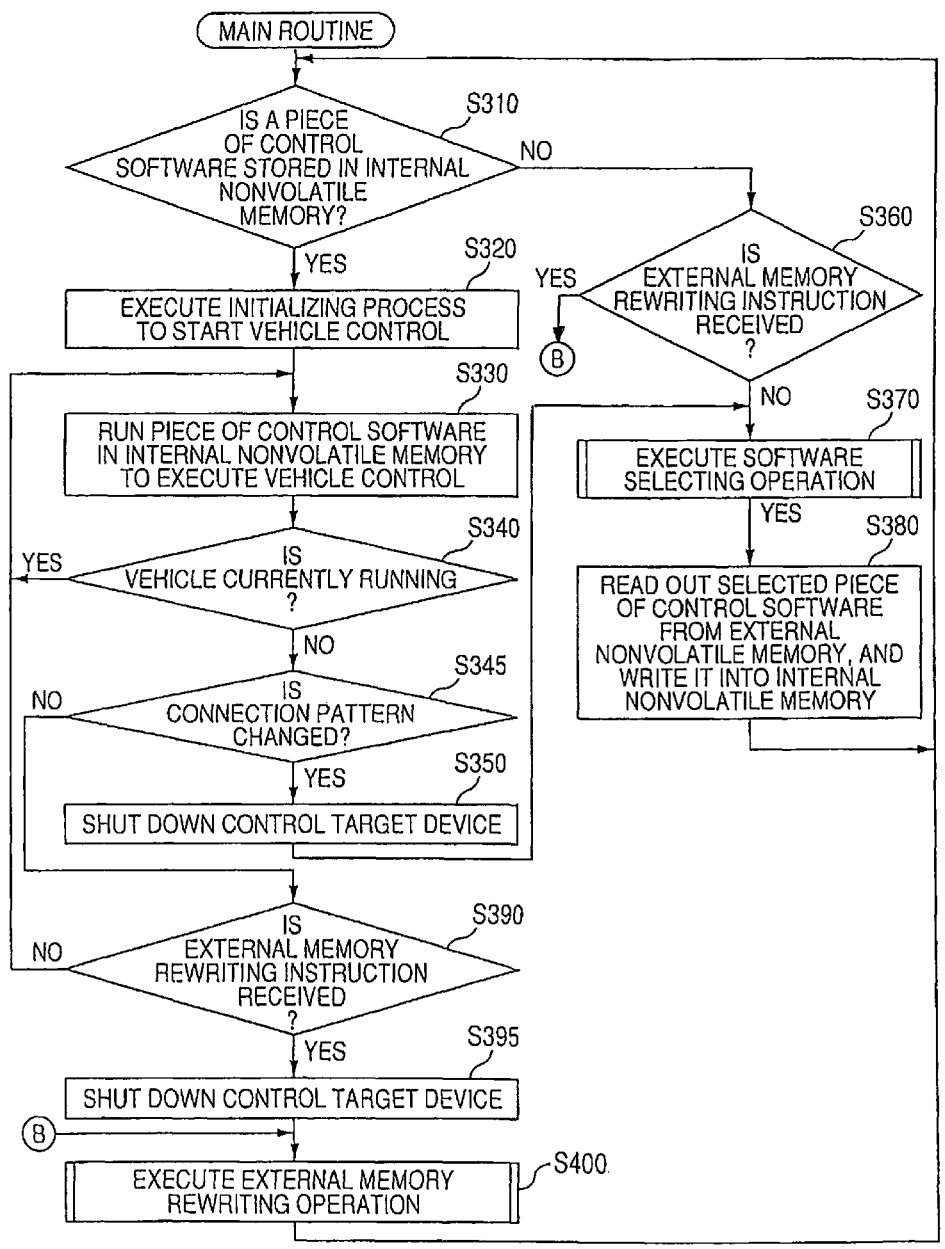
FIG. 8 is a flowchart schematically illustrating a main routine to be executed by at least one ECU according to the second embodiment.

Referring to FIG. 8, when power is applied to at least one ECU 10, the CPU 21 of the at least one ECU 10 starts to run the main routine in accordance with the main software stored in the internal nonvolatile memory 23.

In step S310 of the main routine, the CPU 21 determines whether a piece of control software is stored in the internal nonvolatile memory 23.

If it is determined that no pieces of software are stored in the internal nonvolatile memory 23, the determination in step S310 is NO. Then, the CPU 21 proceeds to step S360.

In step S360, the CPU 21 determines whether to receive the external memory rewriting instruction from the external device 3 via the interface 9, the CAN 11, and the communication interface 27.

If it is determined the external memory rewriting instruction from the external device 3 is received (the determination in step S360 is YES), the CPU 21 shifts to step S400, and executes the subroutine for the external memory rewriting operation in step S400 (see FIG. 4). After completion of the external memory rewriting operation, the CPU 21 returns to step S310.

Otherwise if it is determined that the external memory rewriting instruction is not received (the determination in step S360 is NO), the CPU 21 shifts to step S370. In step S370, the CPU 21 executes a software selecting operation, which will be described hereinafter and illustrated in FIG. 9.

A subroutine for the software selecting operation in step S370 to be executed by the CPU 21 will be described hereinafter with reference to FIG. 9.

It is to be noted that FIG. 10 schematically illustrates the connection relationship between the in-vehicle devices DEV and each of the first and second I/O ports P1 and P2.

In starting the software selecting operation, the CPU 21 determines whether at least one in-vehicle device DEV is connected to the first I/O port P1 in step S371.

If it is determined that the high-level signal is input to the first I/O port P1, the CPU 21 determines that no in-vehicle devices DEV are connected to the first I/O port P1 (the determination in step S371 is NO), proceeding to step S372. In step S372, the CPU 21 determines whether at least one in-vehicle device DEV is connected to the second I/O port P1 in step S372.

If it is determined that the high-level signal is input to the second I/O port P2, the CPU 21 determines that no in-vehicle devices DEV are connected to the second I/O port P2 (the determination in step S372 is NO), proceeding to step S373.

In step S373, the CPU 21 determines the record R1 with the index 1 in the software selecting table TA as a search record, shifting to step S379.

In contrast, if it is determined that a low-level signal lower in level than the high level signal is input to the second I/O port P2, the CPU 21 determines that at least one in-vehicle device DEV is connected to the second I/O port P2 (the determination in step S372 is YES), proceeding to step S374.

In step S374, the CPU 21 determines the record R2 with the index 2 in the software selecting table TA as the search record, shifting to step S379.

Otherwise if it is determined that a low-level signal lower in level than the high-level signal is input to the first I/O port P1, the CPU 21 determines at least one in-vehicle device DEV is connected to the first I/O port P1 (the determination in step S371 is YES), proceeding to step S376. In step S376, the CPU 21 determines whether at least one in-vehicle device DEV is connected to the second I/O port P1, which is similar to step S372.

If it is determined that the high-level signal is input to the second I/O port P2, the CPU 21 determines that no in-vehicle devices DEV are connected to the second I/O port P2 (the determination in step S376 is NO), proceeding to step S377.

In step S377, the CPU 21 determines the record R3 with the index 3 in the software selecting table TA as the search record, shifting to step S379.

In contrast, if it is determined that the low-level signal is input to the second I/O port P2, the CPU 21 determines that at least one in-vehicle device DEV is connected to the second I/O port P2 (the determination in step S376 is YES), proceeding to step S378.

In step S378, the CPU 21 determines the record R4 with the index 4 in the software selecting table TA as the search record, shifting to step S379.

In step S379, the CPU 21 searches the search record determined by any one of the operations in steps S373, S374, S378, and S379 in the software selecting table TA to thereby grasp at least one software ID indicative of the type of at least one piece of control software meeting any one of the first to fourth types of the vehicle V corresponding to the search record used in step S379.

Then, the CPU 21 determines at least one piece of control software whose software ID is identical to the grasped at least one software ID as writing target control software to be written into the internal nonvolatile memory 23. Thereafter, the CPU 21 exits the subroutine for the software selecting operation, returning to S310 of the main routine.

After completion of the software selecting operation in step S370, in step S380, the CPU 21 reads out, from the external nonvolatile memory 30, the at least one piece of control software determined in step S370 to thereby write the readout at least one piece of control software into the data-rewritable area 23a2 of the internal nonvolatile memory 23. Thereafter, the CPU 21 returns to step S310.

On the other hand, if it is determined that a piece of control software is stored in the internal nonvolatile memory 23 (the determination in step S310 is YES), the CPU 21 proceeds to step S320.

In step S320, the CPU 21 executes an initializing process required to start the vehicle control. For example, as the initializing process, the CPU 21 initializes the corresponding control-target devices 7.

After the initializing process in step S320, the CPU 21 proceeds to step S330, and runs the piece of control software stored in the data-rewritable area 23a2 thereon. This allows the CPU 21 to execute an allocated part of the vehicle control based on the piece of control software.

After completion of the allocated part of the vehicle control based on the piece of control software at a given cycle, the CPU 21 proceeds to step S340, and determines whether the vehicle V is currently running based on the measurand currently monitored by the vehicle speed sensor 5 in step S340.

If it is determined that the vehicle V is currently running based on the measurand currently monitored by the vehicle speed sensor 5 (the determination in step S340 is YES), the CPU 21 returns to step S330 and repeatedly executes the vehicle control operations in steps S330 and S340 until the determination in step S340 is NO.

Otherwise if it is determined that the vehicle V is not currently running, in other words, the vehicle V is parked, the CPU 21 proceeds to step S345.

In step S345, the CPU 21 determines whether the connection pattern between at least one in-vehicle device DEV and each of the first and second I/O ports P1 and P2 changes based on the level of the signal input to each of the first and second I/O ports P1 and P2.

Specifically, in step S345, the CPU 21 determines whether:

at least one in-vehicle device DEV is newly connected to the first I/O port P1 when no in-vehicle devices DEV are connected beforehand to the first I/O port P1;

at least one in-vehicle device DEV is removed from the first I/O port P1 when the at least one in-vehicle device DEV is connected in advance to the first I/O port P1;

at least one in-vehicle device DEV is newly connected to the second I/O port P2 when no in-vehicle devices DEV are connected beforehand to the second I/O port P2; and at least one in-vehicle device DEV is removed from the second I/O port P2 when the at least one in-vehicle device DEV is connected to the second I/O port P2.

If it is determined that the connection pattern between at least one in-vehicle device DEV and each of the first and second I/O ports P1 and P2 changes with change in the type of the vehicle V depending on attachment or removal of at least one in-vehicle device DEV from/to the first I/O port P1 or the second I/O port P2 (the determination in step S345 is YES), the CPU 21 proceeds to step S350.

In step S350, the CPU 21 shuts down the allocated part of the vehicle control. For example, the CPU 21 shuts down a corresponding at least one control-target device 7 when it is connected to at least one of the first and second I/O ports P1 and P2.

After completion of the operation in step S350, the CPU 21 shifts to step S370, and executes the software selecting operation in step S370 set forth above to thereby determine at least one piece of control software meeting the changed connection pattern between at least one in-vehicle device DEV and each of the first and second I/O ports P1 and p2; this changed connection pattern determines any one of the first to fourth types of the vehicle V Next, in step S380, the CPU 21 reads out, from the external nonvolatile memory 30A, the at least one piece of control software determined in step S370 to thereby overwrite, with the readout at least one piece of control software, the piece of control software stored in the internal nonvolatile memory 23.

After completion of the operation in step S380, the CPU 21 returns to step S310, and after completion of the operations in steps S310 and S320, the CPU 21 runs the at least one piece of control software stored in the internal nonvolatile memory 23 thereon in step S330.

Otherwise if it is determined that the connection pattern between at least one in-vehicle device DEV and each of the first and second I/O ports P1 and P2 remains unchanged (the determination in step S345 is NO), the CPU 21 proceeds to step S390.

In step S390, the CPU 21 determines whether to receive the external memory rewriting instruction via the communication interface 27 from the external device 3.

If it is determined that no external memory rewriting instructions are received (the determination in step S390 is NO), the CPU 21 shifts to step S330, and runs the at least one piece of control software stored in the internal nonvolatile memory 23 thereon.

Otherwise if it is determined that the external memory rewriting instruction is received (the determination in step S390 is YES), the CPU 21 shifts to step S395, and shuts down the allocated part of the vehicle control. For example, the CPU 21 shuts down the corresponding control-target devices 7.

After completion of the operation in step S395, the CPU 21 executes the external memory rewriting operation in step S400 (see step S210 to S280 in FIG. 4), and thereafter, the CPU 21 shifts to step S310.

As described above, at least one ECU 10 according to the second embodiment is configured to:

determine whether the connection pattern between at least one in-vehicle device DEV and each of the first and second I/O ports P1 and P2 changes (see S345 in FIG. 8); and determine whether a piece of control software stored in the internal nonvolatile memory 23 meets the type of the vehicle V if it is determined that the connection pattern changes (see step S370 in FIG. 8).

Specifically, if it is determined that the connection pattern between at least one in-vehicle device DEV and each of the first and second I/O ports P1 and P2 changes with change in the type of the vehicle V, at least one ECU 10 executes the software selecting operation (see step S370 in FIG. 8). Execution of the software selecting operation allows the changed connection pattern between at least one in-vehicle device DEV and each of the first and second I/O ports P1 and P2 to be identified, making it possible for at least one ECU 10 to identify the changed type of the vehicle V.

Next, at least one ECU 10 is configured to read out, from the external nonvolatile memory 30A, at least one piece of control software meeting the type of the vehicle V to thereby update, to the readout piece of control software, the piece of control software stored in the internal nonvolatile memory 23. This allows the piece of control software stored in the internal nonvolatile memory 23 to be updated to a new piece of control software meeting the changed type of the vehicle V.

That is, at least one ECU 10 installed in the vehicle V according to the second embodiment is configured to:

read out, by itself, a piece of control software from the external nonvolatile memory 30A, the piece of control software meeting the type of the vehicle V; and write the readout piece of control software into the internal nonvolatile memory 23.

It is therefore possible to write, into the internal nonvolatile memory 23, a piece of control software meeting the type of the vehicle V without input, to at least one ECU 10, of any instructions and/or pieces of control software from the external device 3. This allows the CPU 21 of the at least one ECU 10 to execute the piece of control software stored in the internal nonvolatile memory 23.

Specifically, in the second embodiment, it is possible for the microcomputer 20 of at least one ECU 10 to automatically execute the control-software writing task into the internal nonvolatile memory 23 without requiring the external device 3, which allows the at least one ECU 10 to easily conform with the type of the vehicle V.

In addition, when no pieces of control software are stored in the internal nonvolatile memory 23, at least one ECU 10 according to the second embodiment is configured to:

read out a piece of control software from the external nonvolatile memory 30A, the piece of control software being stored therein and meeting the type of the vehicle V (see steps S370 and S380 in FIG. 8); and write the readout piece of control software into the internal nonvolatile memory 23 (see step s S370 and S380 in FIG. 8).

Accordingly, there is no necessity to write at least one piece of control software into the internal nonvolatile memory 23 before installing at least one ECU 10 into vehicles, making it possible to reduce the number of manufacturing processes of vehicles at the vehicle production lines.

In addition, when an option(s) is retrofitted to the vehicle V, at the retrofit of the option, the microcomputer 20 of at least one ECU 10 is configured to:

determine whether the option is connected to the I/O interface 25 so that the connection pattern between at least one in-vehicle device DEV and each of the first and second I/O ports P1 and P2 changes (see step S345 in FIG. 8); and read out a piece of control software stored in the external nonvolatile memory 30A therefrom, the piece of control software meeting the changed connection pattern and thus the changed type of the vehicle V due to the retrofit of the option to thereby write the readout piece of control software into the internal nonvolatile memory 23 (see steps S370 and S380 in FIG. 8).

Accordingly, when retrofitting an option(s) to the vehicle V, an operator simply installs the option in the vehicle V, and electrically connects it to the I/O interface 25 without taking the time to rewrite a piece of control software stored in the internal nonvolatile memory 23 using the external device 3.

It is to be noted that, in the second embodiment, at least one ECU 10 is configured to identify the type of the vehicle V based on the connection pattern between at least one in-vehicle device DEV and each of the first and second I/O ports P1 and P2. The present invention however is not limited to the structure.

Specifically, types of ECUs 10, such as functions thereof, to be installed in vehicles normally depend on the types of the vehicles. In other words, the structure of a vehicle control system normally depends on each type of vehicles in which the vehicle control system 1 is installed.

At least one ECU 10 therefore can be configured to:

communicate with the remaining ECUs 10 through the communication interface 27; and determine whether the structure of the vehicle communication system 1, such as the types of all ECUs 10 electrically connected to the CAN 11 to thereby identify the type of the vehicle V based on the determined structure of the vehicle communication system.

Third Embodiment

A vehicle control system according to a third embodiment of the present invention will be described hereinafter.

Like reference characters are assigned to like parts in the vehicle control systems according to the third embodiment and each of the first and second embodiments. Descriptions of the parts of the vehicle control system according to the third embodiment will be therefore omitted, and different parts of the vehicle control system according to the third embodiment from that according to each of the first and second embodiments will be described in detail hereinafter.

Figure 11:
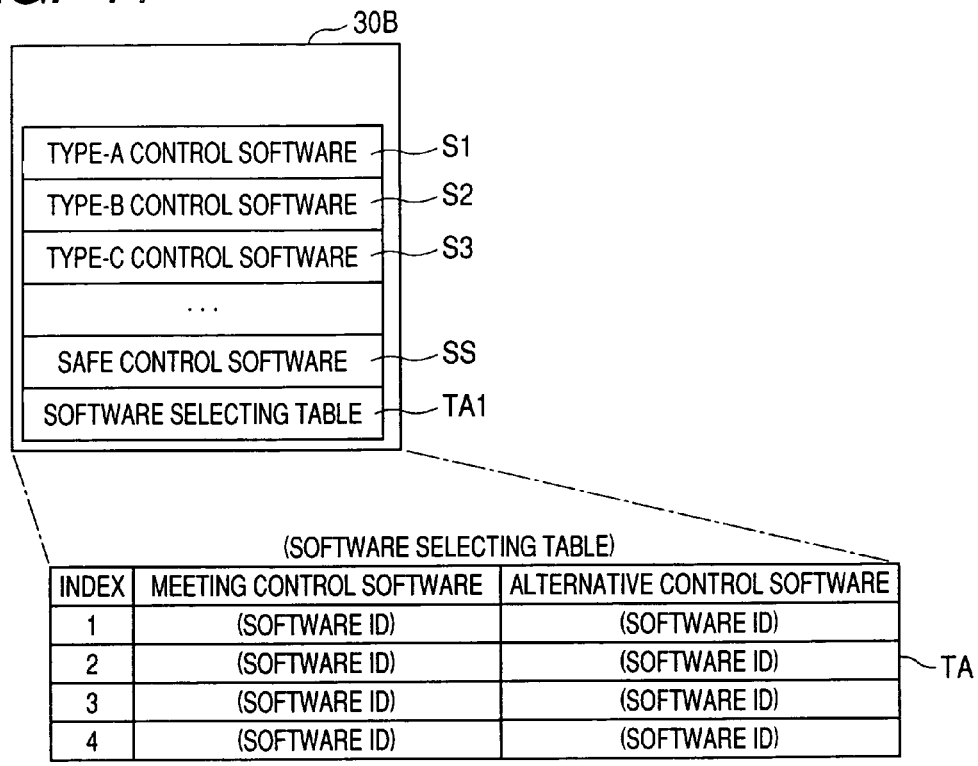
FIG. 11 is a view schematically illustrating an example of the structure of an external nonvolatile memory of a vehicle control system according to a third embodiment of the present invention.

As in the case of the second embodiment, each ECU 10 of the vehicle control system according to the third embodiment includes a software selecting table TA1 stored in an external nonvolatile memory 30B, whose structure is schematically illustrated in FIG. 11.

As illustrated in FIG. 11, the software selecting table TA1 consists essentially of a collection of records RA1 to RAn (n is an integer greater than or equal to 2). The records RA1 to RAn respectively correspond to the predetermined types of vehicles.

Specifically, each of the records RA1 to RAn stores:

a first software ID uniquely indicative of the type of one piece of control software corresponding to one type in the predetermined types of vehicles;

a second software ID uniquely indicative of the type of another one piece of control software associated with the piece of control software; and an index associated with the first and second software IDs.

In each of the records RA1 to RAn, another one piece of control software corresponding to the one piece of control software is used when a failure occurs in the corresponding one piece of control software. In each of the records RA1 to RAn, one piece of control software corresponding to one type in the predetermined types of vehicles will be referred to as "a piece of type-matched control software". In addition, another one piece of control software is used when a failure occurs in the corresponding one piece of type-matched control software will be referred to as "a piece of alternative control software".

Specifically, in the third embodiment, the external nonvolatile memory 30B stores, at respective predetermined address fields therein, a plurality of pieces S1 to Sn of type-matched control software beforehand, and, at respective predetermined address fields therein, a plurality of pieces of alternative control software beforehand.

In addition, the external nonvolatile memory 30B stores, as a predetermined address field, a piece of safe control software SS beforehand; this piece of safe control software is commonly applicable to the predetermined types of vehicles.

The piece of safe control software SS is designed to cause a computer to execute a barebones vehicle control required to run the vehicle V safely.

The piece of safe control software SS is also designed to be executable on the external nonvolatile memory 30B having a predetermined access rate slower than that of the internal nonvolatile memory 23. In other words, the pieces of type-matched control software and the pieces of alternative control software are designed to be optimally executable on the internal nonvolatile memory 23.

It is to be noted that, as an example of a piece of alternative control software, a piece of control software corresponding to one type in the predetermined types of vehicles, which is similar to one type of a piece of type-matched control software, can be used.

It is also to be noted that, as an example of a piece of alternative control software, a piece of control software commonly applicable to the predetermined types of vehicles can be used.

The piece of control software commonly applicable to the predetermined types of vehicles can cause at least one ECU 10 to implement standard vehicle control including standard power train control, standard driving control, standard body control, and standard communication control. This standard vehicle control allows normal driving of the vehicle V.

In other words, the piece of control software commonly applicable to the predetermined types of vehicles cannot achieve specific vehicle control using specific in-vehicle devices with which the vehicle V can be optionally equipped.

Like the second embodiment, the type of vehicle V in which the vehicle control system 1 according to the third embodiment is installed is previously determined to any one of the first to fourth types of vehicles.

The record RA1 with the index 1 in the software selecting table TA1 stores a first software ID indicative of the type of at least one piece of type-matched control software meeting the first type of vehicles, and a second software ID indicative of the type of at least one piece of alternative control software;

The record RA2 with the index 2 in the software selecting table TA1 stores a first software ID indicative of the type of at least one piece of type-matched control software meeting the second type of vehicles, and a second software ID indicative of the type of at least one piece of alternative control software;

The record RA3 with the index 3 in the software selecting table TA1 stores a first software ID indicative of the type of at least one piece of type-matched control software meeting the third type of vehicles, and a second software ID indicative of the type of at least one piece of alternative control software;

The record RA4 with the index 4 in the software selecting table TA1 stores a fourth software ID indicative of the type of at least one piece of type-matched control software meeting the fourth type of vehicles, and a second software ID indicative of the type of at least one piece of alternative control software.

Next, a main routine to be executed by the CPU 21 of the microcomputer 20 of at least one ECU 10 according to the third embodiment in accordance with a main software stored in the internal nonvolatile memory 23 will be described with reference to FIGS. 12 to 14.

Like the main routine illustrated in FIG. 8 according to the second embodiment, the CPU 21 of at least one ECU 10 executes the operations illustrated in steps S310 to S330.

Specifically, the CPU 21 of at least one ECU 10 runs a piece of control software stored in the data-rewritable area 23$a$2 thereon. This allows the CPU 21 to execute an allocated part of the vehicle control based on the piece of control software.

Figure 12:
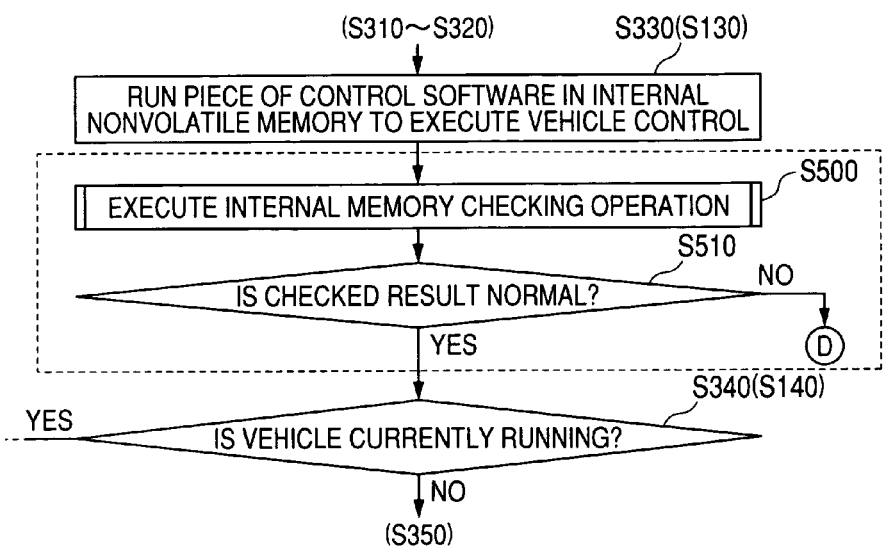
FIG. 12 is a flowchart schematically illustrating a part of a main routine to be executed by at least one ECU according to the third embodiment.

After completion of the allocated part of the vehicle control based on the piece of control software at a given cycle in step S330, the CPU 21 proceeds to step S500 to execute an internal memory checking operation in step S500 in FIG. 12.

Next, a subroutine for the internal memory checking operation in step S500 to be executed by the CPU 21 will be described hereinafter with reference to FIG. 14.

In starting the internal memory checking operation, the CPU 21 sets, to a checking address, the leading address of a predetermined address field in which the piece of control software is stored in the internal nonvolatile memory 23 in step S710.

Next, the CPU 21 sets, to a reference address, the leading address of a predetermined address field in the external nonvolatile memory 30B; this predetermined address field stores in advance a piece of type-matched control software whose software ID is identical to the piece of control software stored in the internal nonvolatile memory 23 in step S720.

Subsequently, the CPU 21 reads out an instruction code of the piece of control software stored at the checking address in the internal nonvolatile memory 23 therefrom in step S730. Next, the CPU 21 reads out an instruction code of the piece of type-matched control software stored at the reference address in the external nonvolatile memory 30B therefrom in step S740.

Then, in step S750, the CPU 21 compares the readout instruction code of the piece of control software stored at the checking address with the readout instruction code of the piece of type-matched control software stored at the reference address. Based on the compared result, the CPU 21 determines whether the readout instruction code of the piece of control software stored at the checking address matches the readout instruction code of the piece of type-matched control software stored at the reference address in step S750.

If it is determined that the readout instruction code of the piece of control software stored at the checking address is in agreement with the readout instruction code of the piece of type-matched control software stored at the reference address in step S750 (the determination in step S750 is YES), the CPU 21 goes to step S760.

In step S760, the CPU 21 increments the checking address by 1, and in step S770, the CPU 21 increments the reference address by 1, shifting to step S780.

In step S780, the CPU 21 determines whether the last address of the predetermined address field in which the piece of control software is stored in the internal nonvolatile memory 23 is subjected to the comparing operation in step S750.

If it is determined that the last address of the predetermined address field in which the piece of control software is stored in the internal nonvolatile memory 23 is not subjected to the comparing operation in step S750 (the determination in step S780 is NO), the CPU 21 returns to step S730.

Specifically, the CPU 21 repeatedly executes the operations in steps S730 to S780 until the determination in step S750 is negative or the determination in step S780 is affirmative.

In other words, address to address checking whether the instruction code of the piece of control software stored in the predetermined address field in the internal nonvolatile memory 23 matches the instruction code of the piece of type-matched control software stored in the predetermined address field in the external nonvolatile memory 30B is performed until the determination in step S750 is negative or the determination in step S780 is affirmative.

If it is determined that the readout instruction code of the piece of control software stored at the checking address is in disagreement with the readout instruction code of the piece of type-matched control software stored at the reference address in step S750 (the determination in step S750 is NO), the CPU 21 goes to step S790.

In step S790, the CPU 21 determines an abnormal storing condition of the piece of control software in the internal nonvolatile memory 23, and thereafter, returns to the main routine.

If it is determined that the last address of the predetermined address field in the internal nonvolatile memory 23 is subjected to the comparing operation (the determination in step S750 is YES), the CPU 21 determines that the piece of control software stored in the internal nonvolatile memory 23 is normal in step S800. Then, the CPU 21 returns to the main routine.

Returning to the main routine, when the internal memory checking operation in step S500 is completed set forth above, the CPU 21 proceeds to step S510, and determines whether the determined result of the internal memory checking operation indicates that the piece of control software stored in the internal nonvolatile memory is normal in step S510.

If it is determined that the determined result of the internal memory checking operation indicates that the piece of control software stored in the internal nonvolatile memory 23 is normal (the determination in step S510 is YES), the CPU 21 shifts to step S340 illustrated in FIG. 8.

Figure 13:
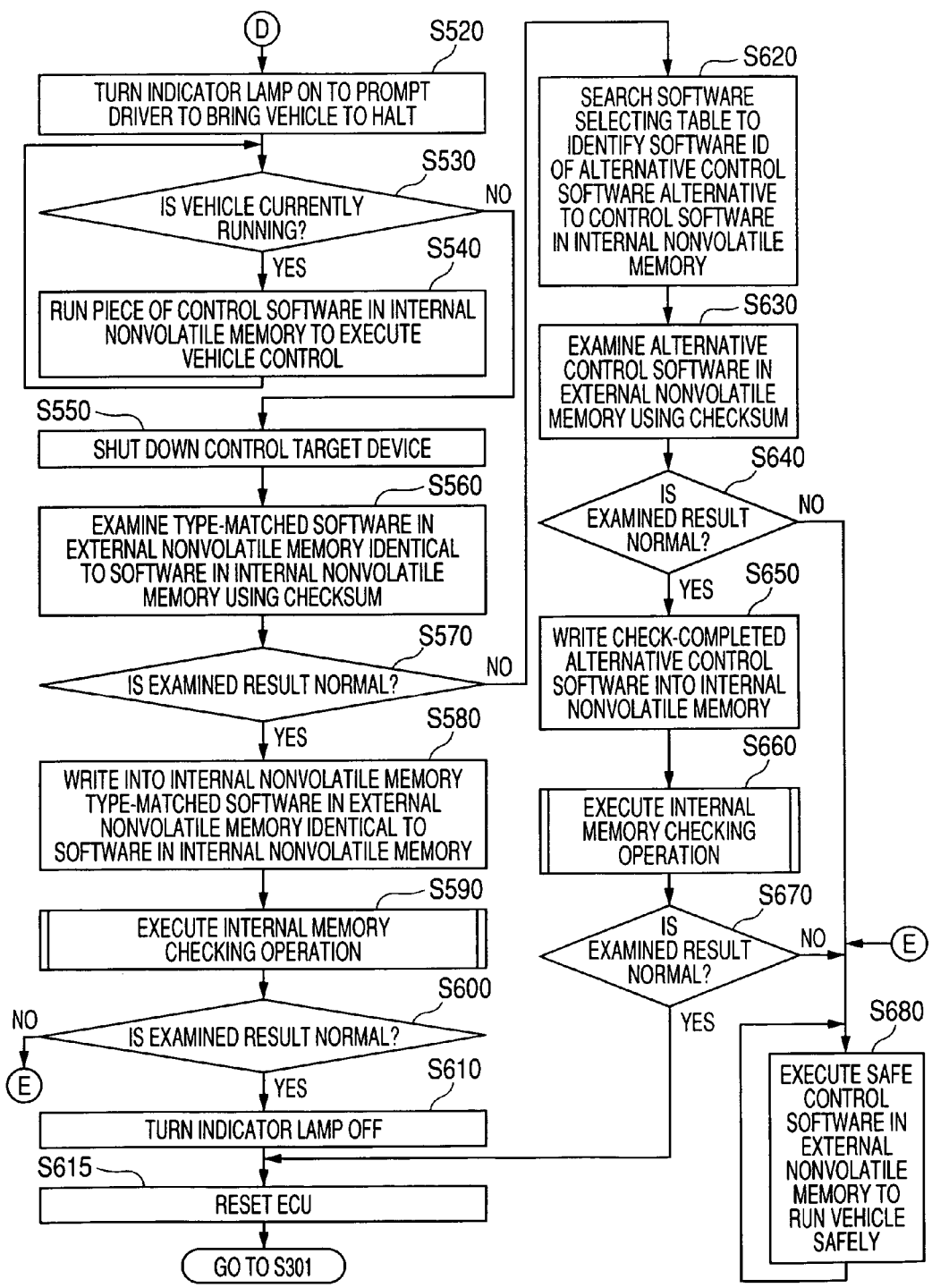
FIG. 13 is a flowchart schematically illustrating a part of the main routine to be executed by at least one ECU according to the third embodiment.

Otherwise if it is determined that the determined result of the internal memory checking operation indicates that the piece of control software stored in the internal nonvolatile memory 23 is abnormal (the determination in step S510 is NO), the CPU 21 shifts to step S520 (see FIG. 13).

In step S520, the CPU 21 controls at least one of the indicator lamps to cause it to illuminate warning light to prompt a driver to bring the vehicle V to a halt.

It is to be noted that, if the at least one of the indicator lamps is electrically connected to the I/O interface 25 of at least one ECU 10, such as the body-control ECU 10a5, the at least one ECU 10 can directly control the at least one of the indicator lamps to illuminate the warning light.

It is also to be noted that, if the at least one of the indicator lamps has no direct electrical connection to the I/O interface 25 of at least one ECU 10 except for the body-control ECU 10a5, the at least one ECU 10 can control, through the body-control ECU 10a5, the at least one of the indicator lamps to illuminate the warning light.

After the warning light illuminating operation in step S520, the CPU 21 proceeds to step S530, and determines whether the vehicle V is currently running based on the measurand currently monitored by the vehicle speed sensor 5 in step S530.

If it is determined that the vehicle V is currently running based on the measurand currently monitored by the vehicle speed sensor 5 (the determination in step S530 is YES), the CPU 21 repeatedly executes the vehicle control operation in step S540 at a given cycle until the determination in step S530 is NO. The vehicle control operation in step S530 corresponds to the vehicle control operation in step S330 in FIG. 8.

It is to be noted that the reason to execute the vehicle control operation in step S540 irrespective of detection of a failure in the piece of control software is because, if the vehicle control operation is forcibly interrupted even though the vehicle V is running, the vehicle traveling stability may be scarcely maintainable.

Otherwise if it is determined that the vehicle V is not currently running, in other words, the vehicle V is parked, the CPU 21 proceeds to step S550. In step S550, the CPU 21 shuts down the allocated part of the vehicle control. For example, the CPU 21 shuts down a corresponding at least one control-target device 7.

After completion of the operation in step S550, the CPU 21 shifts to step S560. In step S560, the CPU 21 examines a piece of type-matched control software, whose software ID is identical to that of the piece of control software stored in the internal nonvolatile memory 23, stored in the external nonvolatile memory 30B using one of various program-error detection methods, such as checksum in step S560.

For example, the CPU 21 divides the piece of control software stored in the internal nonvolatile memory 23 into data blocks each consisting a predetermined number of bits, and similarly, divides the corresponding piece of type-matched control software stored in the external nonvolatile memory 30B into data blocks each consisting a predetermined number of bits. Next, the CPU 21 computes the sum of the data blocks of the piece of control software stored in the internal nonvolatile memory 23, and the sum of the data blocks of the piece of type-matched control software stored in the external nonvolatile memory 30B.

Then, the CPU 21 compares the sum of the data blocks of the piece of type-matched control software stored in the external nonvolatile memory 30 with the sum of the data blocks of the piece of control software stored in the internal nonvolatile memory 23.

Based on the compared result, the CPU 21 determines whether the sum of the data blocks of the piece of type-matched control software stored in the external nonvolatile memory 30B is equal to the sum of the data blocks of the piece of control software stored in the internal nonvolatile memory 23 in step S570.

Specifically, if it is determined that the sum of the data blocks of the piece of type-matched control software stored in the memory 30B is equal to the sum of the data blocks of the piece of control software stored in the internal nonvolatile memory 23, the CPU 21 determines that check result in step S560 is normal. In other words, the determination in step S570 is YES. Then, the CPU 21 proceeds to step S580.

In step S580, the CPU 21 reads out the check-completed piece of type-matched control software stored in the external nonvolatile memory 30B therefrom, and overwrites, with the readout piece of type-matched control software, the piece of control software stored in the internal nonvolatile memory 23.

Figure 14:
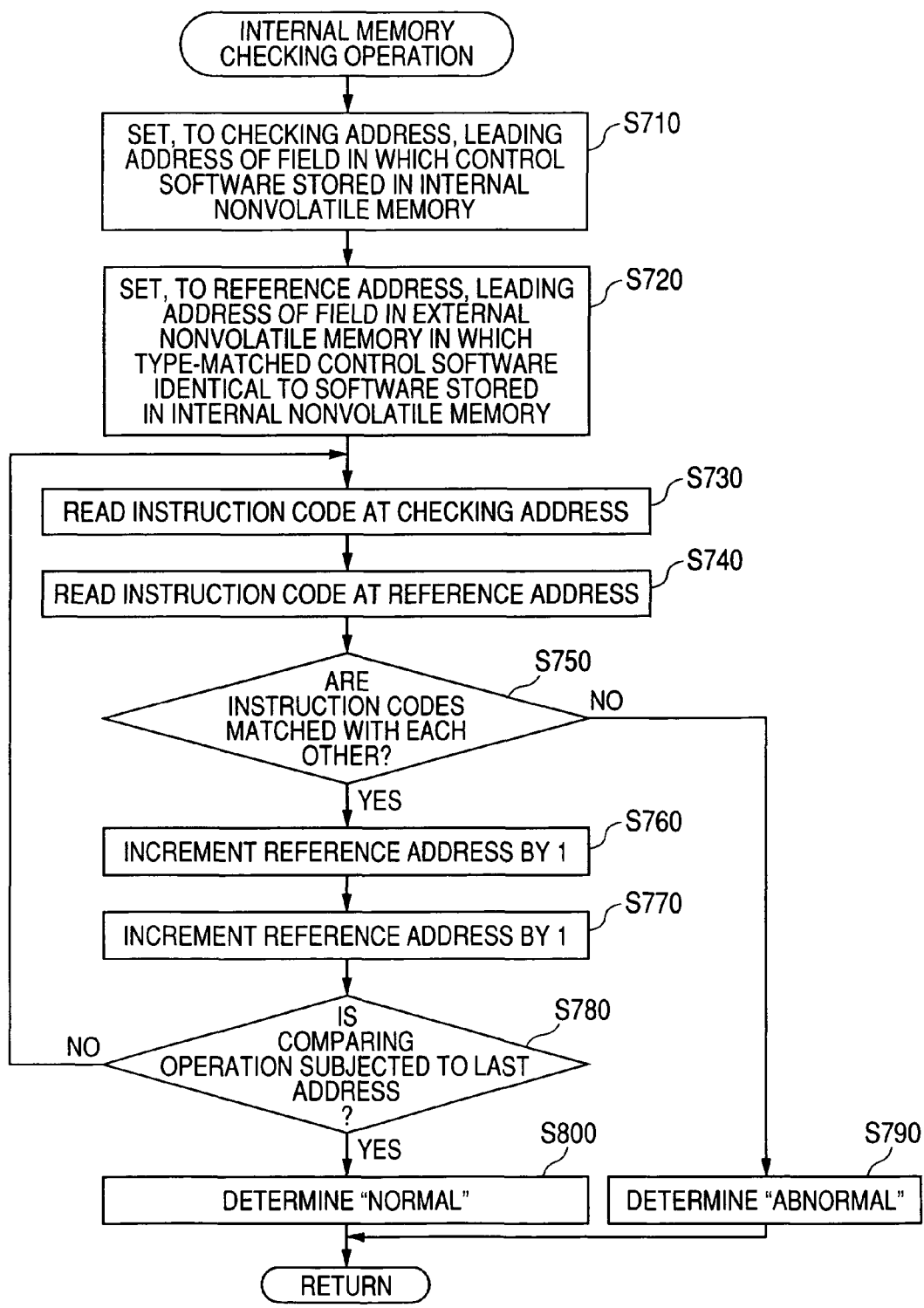
FIG. 14 is a flowchart schematically illustrating a subroutine for an internal memory checking operation in step S500 of FIG. 12 to be executed by at least one ECU according to the third embodiment.

After completion of the operation in step S580, the CPU 21 shifts to step S590 and executes the internal memory checking operation step S590; this internal memory checking operation has been already described in detail in steps S710 to S800 (see FIG. 14).

After completion of the internal memory checking operation in step S590, the CPU 21 proceeds to step S600.

In step S600, the CPU 21 determines whether the determined result of the internal memory checking operation in step S590 indicates that the piece of type-matched control software stored in the internal nonvolatile memory 23 in step S580 is normal.

If it is determined that the determined result of the internal memory checking operation indicates that the piece of type-matched control software stored in the internal nonvolatile memory 23 is normal (the determination in step S600 is YES), the CPU 21 shifts to step S610. In step S610, the CPU 21 controls the at least one of the indicator lamps so that it turns off the warning light illuminated therefrom by the operation in step S520.

After completion of the operation in step S610, the CPU 21 resets itself (its at least one ECU 10) in step S615, and starts to execute the main routine from step S301 thereof (see FIGS. 8 and 12 to 14).

Otherwise if it is determined that the determined result of the internal memory checking operation indicates that the piece of type-matched control software stored in the internal nonvolatile memory 23 is abnormal (the determination in step S600 is NO), the CPU 21 shifts to step S680.

In step S680, the CPU 21 directly accesses the piece of safe control software SS stored in the external nonvolatile memory 30B to execute it thereon, to thereby run the vehicle V safely. For example, the operation in step S680 continues until the vehicle V comes to stop.

On the other hand, if it is determined that the sum of the data blocks of the piece of type-matched control software stored in the memory 30B is in disagreement with the sum of the data blocks of the piece of control software stored in the internal nonvolatile memory 23, the CPU 21 determines that check result in step S560 is abnormal. In other words, the determination in step S570 is NO. Then, the CPU 21 proceeds to step S620.

In step S620, the CPU 21 searches the software selecting table TA1 for one of the records RA1 to RAn; this one of the records RA1 to Ran represents one of the pieces of type-matched control software whose software ID is identical to that of the piece of control software currently stored in the internal nonvolatile memory 23. Thereafter, in step S620, the CPU 21 identifies the software ID of a piece of alternative control software designated by the searched one of the records RA1 to RAn.

In another operation in step S620, because the piece of control software currently stored in the internal nonvolatile memory 23 is lastly selected in step S370, the CPU 21 searches the software selecting table TA1 for the lastly searched record in step S370. Thereafter, in another operation in step S620, the CPU 21 identifies the software ID of a piece of alternative control software designated by the searched record.

After completion of the operation in step S620, the CPU 21 retrieves a piece of alternative control software with the identified software ID from the external nonvolatile memory 30B in step S630. Next, in step S630, the CPU 21 examines the retrieved piece of alternative control software using one of various program-error detection methods, such as checksum.

For example, in the third embodiment, when the plurality of pieces of alternative control software are stored in the external nonvolatile memory 30B, the CPU 21 divides each piece of alternative control software into data blocks each consisting a predetermined number of bits. Thereafter, the CPU 21 computes the sum of the data blocks of each piece of alternative control software, to thereby store the computed value as a first checksum value in, for example, the external nonvolatile memory 30B.

In step S630, the CPU 21 divides the retrieved piece of alternative control software into data blocks each consisting a predetermined number of bits. Next, the CPU 21 computes the sum of the data blocks of the retrieved piece of alternative control software as a second checksum value.

Then, the CPU 21 compares the first checksum value stored in the external nonvolatile memory 30B with the second checksum value.

Based on the compared result, the CPU 21 determines whether the first checksum value is equal to the second checksum value in step S640.

Specifically, if it is determined that the first checksum value is equal to the second checksum value, the CPU 21 determines that check result in step S630 is normal (the determination in step S640 is YES), proceeding to step S650.

Otherwise if it is determined that the first checksum value is in disagreement with the second checksum value, the CPU 21 determines that check result in step S630 is abnormal (the determination in step S640 is NO), proceeding to step S680.

In step S650, the CPU 21 reads out the check-completed piece of alternative control software stored in the external nonvolatile memory 30B therefrom, and overwrites, with the readout piece of the alternative control software, the piece of control software stored in the internal nonvolatile memory 23.

After completion of the operation in step S650, the CPU 21 shifts to step S660 and executes the internal memory checking operation step S660; this internal memory checking operation has been already described in detail in steps S710 to S800 (see FIG. 14).

After completion of the internal memory checking operation in step S660, the CPU 21 proceeds to step S670.

In step S670, the CPU 21 determines whether the determined result of the internal memory checking operation in step S660 indicates that the piece of alternative control software stored in the internal nonvolatile memory 23 in step S650 is normal.

If it is determined that the determined result of the internal memory checking operation indicates that the piece of alternative control software stored in the internal nonvolatile memory 23 is normal (the determination in step S670 is YES), the CPU 21 shifts to step S610. In step S610, the CPU 21 controls the at least one of the indicator lamps so that it turns off the warning light illuminated therefrom by the operation in step S520.

After completion of the operation in step S610, the CPU 21 resets itself (its at least one ECU 10) in step S620, and starts to execute the main routine from step S301 thereof (see FIGS. 8 and 12 to 14).

Otherwise if it is determined that the determined result of the internal memory checking operation indicates that the piece of alternative control software stored in the internal nonvolatile memory 23 is abnormal (the determination in step S670 is NO), the CPU 21 shifts to step S680.

In step S680, the CPU 21 directly accesses the piece of safe control software SS stored in the external nonvolatile memory 30B to execute it thereon. For example, the operation in step S680 continues until the vehicle V comes to stop.

As described above, at least one ECU 10 according to the third embodiment is configured to:

check whether an error arises in a piece of control software stored in the internal nonvolatile memory 23 by the internal memory checking operation in step S500 (steps S710 to S800);

read out the check-completed piece of type-matched control software, whose software ID is identical to that of the piece of control software stored in the internal nonvolatile memory 23, stored in the memory 30B therefrom if it is determined that an error arises in the piece of control software stored in the internal nonvolatile memory 23 (the determination in step S510 is NO); and overwrite, with the readout piece of type-matched control software, the piece of control software stored in the internal nonvolatile memory 23 in step S580, to thereby update the error-containing piece of control software to the normal piece of type-matched control software having the same software ID.

Accordingly, when an error arises in a piece of control software stored in the internal nonvolatile memory 23 due to volatilization or the like, it is possible to prevent the error-containing piece of control software from remaining in the internal nonvolatile memory 23, and to store therein the normal piece of type-matched control software having the same software ID without transferring it to at least one ECU 10.

In addition, at least one ECU 10 according to the third embodiment is configured to:

check whether an error arises, due to volatilization or the like, in a piece of type-matched control software stored in the external nonvolatile memory 30B and having the software ID identical to that of the piece of control software stored in the internal nonvolatile memory 23 in step S570;

when it is determined that an error arises in the piece of type-matched control software, read out, from the external nonvolatile memory 30B, the check-completed piece of alternative control software corresponding to the error-containing piece of type-matched control software; and overwrite, with the readout piece of alternative control software, the piece of control software stored in the internal nonvolatile memory 23 in step S650, to thereby update the error-containing piece of control software to the piece of alternative control software.

Accordingly, in the third embodiment, when it may be determined that an error arises in either a piece of control software having a software ID and stored in the internal nonvolatile memory 23 or that of type-matched control software having the same software ID and stored in the external nonvolatile memory 30.

In this case, writing of a piece of alternative control software corresponding to the error-containing piece of type-matched control software into the internal nonvolatile memory 23 allows the error-containing piece of control software stored in the internal nonvolatile memory 23 to be updated to the piece of alternative control software. This causes at least one ECU 10 to implement standard vehicle control, which allows the standard vehicle performance to be kept unchanged without requiring the external device 3.

In order to detect a fault in the storing condition of a piece of control software in the internal nonvolatile memory 23, at least one ECU 10 according to the third embodiment is configured to compare instruction codes of a piece of control software stored at addresses in the internal nonvolatile memory 23 respectively with those of a piece of control software stored at the same addresses in the external nonvolatile memory 30B at the same address thereof. Specifically, bit-to-bit comparison between an instruction code of a piece of control software stored at an address in the internal nonvolatile memory 23 and that of a piece of control software stored at the same address in the external nonvolatile memory 30B can be carried out.

This allows an abnormal storing condition of the piece of control software stored in the internal nonvolatile memory 23 to be detected with high sensitivity.

It is to be noted that there is the possibility that the control-program comparing operation in instruction code increases the load on the CPU 21. In order to reduce the load on the CPU 21, the instruction codes of an identical-type piece of control software stored in each of the internal and external nonvolatile memories 23 and 30 can be therefore respectively divided into groups, and the control-program comparing operation between the control software stored in the internal nonvolatile memory 23 and that stored in the external nonvolatile memory 30 can be carried out in group every cycle of the vehicle control operation.

It is also to be noted that it may be difficult to determine whether a fault arises in the storing condition of a piece of control software stored in the internal nonvolatile memory 23 or in the storing condition of a piece of control software stored in the external nonvolatile memory 30B. For avoiding the circumstances, it is possible to use checksum as an aid to the control-program comparing operation in instruction code.

Even though a piece of control software has no errors (bugs) before writing into the internal nonvolatile memory 23 ("YES" in step S570 or "YES" in step S640), a fault may arise in the piece of control software immediately after it has been written into the internal nonvolatile memory 23 ("NO" in step S600 or "NO" in step S670). In this case, the CPU 21 determines that the internal nonvolatile memory 23 would have a hardware fault, shifting to step S680. In step S680, the CPU 21 directly accesses a piece of safe control software SS stored in the external nonvolatile memory 30B to execute it thereon, to thereby execute a barebones vehicle control required to run the vehicle V safely.

Accordingly, at least one ECU 10 allows the safety of the vehicle V to be ensured even though the internal nonvolatile memory 23 has a hardware fault.

In the third embodiment, the operations in step S500 to S680, which is enclosed by a dashed box in FIG. 12, are integrated in the main routine illustrated in FIG. 8, but the present invention is not limited to the software configuration.

Specifically, the operations in step S500 to S680 are integrated between steps S130 and S140 of the main routine illustrated in FIG. 3 according to the first embodiment.

In this modification, at least one ECU 10 according to the first embodiment has the software selecting table TA1 stored in the external memory 30. After completion of the operation in step S130, the CPU 21 of at least one ECU 10 executes the internal memory checking operation in step S500 in FIGS. 12 and 14.

Next, in step S510, if it is determined that the determined result of the internal memory checking operation indicates that the piece of control software stored in the internal nonvolatile memory 23 is normal (the determination in step S510 is YES), the CPU 21 proceeds to step S140. Subsequently, the CPU 21 executes the operations in steps S140 to S200 illustrated in FIG. 3.

Otherwise if it is determined that the determined result of the internal memory checking operation indicates that the piece of control software stored in the internal nonvolatile memory 23 is abnormal (the determination in step S510 is NO), the CPU 21 proceeds to step S520. Subsequently, the CPU 21 executes the operations in steps S520 to S680 illustrated in FIG. 13.

In each of the first to third embodiments, at least one ECU 10 is programmed to perform a main routine to thereby execute an allocated part of the vehicle control based on a piece of control software stored in the internal nonvolatile memory 23, but the present invention is not limited to the structure.

Specifically, each of the ECUs 10 is programmed to perform a main routine to thereby execute an allocated part of the vehicle control based on a piece of control software stored in the internal nonvolatile memory 23 in cooperation with another ECU 10.

In each of the first to third embodiments, a single piece of control software is written into the internal nonvolatile memory 23 to be stored therein, but, in the present invention, one or more pieces of control software can be written into the internal nonvolatile memory 23 to be stored therein.

The advantages of writing and storing of a single piece of control software in the internal nonvolatile memory 23 are as follows:

Each ECU for vehicles requires high-speed processing, and therefore it is necessary to adopt a high-speed accessible nonvolatile memory as a nonvolatile memory to be integrated in the microcomputer of each ECU.

High-speed accessible nonvolatile memories are normally designed with emphasis on improving their high-speed access performances. For this reason, high-speed accessible nonvolatile memories are unsuitable to increase of their storage capacities (their packaging densities). That is, storing a plurality of pieces of control software in a first nonvolatile memory to be integrated in the microcomputer are difficult in cost and in keeping their high-speed access performances.

In contrast, because a second nonvolatile memory serves as an external storage device of the microcomputer, it need not necessarily have high-speed access performance. In other words, as the second nonvolatile memory, a low-cost nonvolatile memory with normal-speed access performance can be used.

In each of the first to third embodiments, therefore, a single piece of control software is configured to be read out from the external nonvolatile memory 30 in which a plurality of pieces of control software, and the readout single piece of control software is configured to be stored in the internal nonvolatile memory 23.

It is to be noted that, a second nonvolatile memory 30 (30A, 30B) cannot be externally disposed from the microcomputer 21 of at least one ECU 10, but can be integrated in the microcomputer 20 of at least one ECU 10. In this case, as described above, the second nonvolatile memory 30 (30A, 30B) integrated in the microcomputer 20 may be subjected to limitation of its storage capacity, and the ECU production cost may be high. The second nonvolatile memory 30 (30A, 30B) integrated in the microcomputer 20 can however contribute to increase in its access performance because communication lines between the CPU 21 and the second nonvolatile memory 30 (30A, 30B) are so short that data can be hardly delayed therethrough.

In each of the first to third embodiments, as described above, the external nonvolatile memory 30 (30A, 30B) is configured such that its storage capacity is larger than that of the internal nonvolatile memory 23. This allows a large number of pieces of control software meeting a large number of types of vehicles to be stored therein, making it possible to easily write one of the large number of pieces of control software into the internal nonvolatile memory 23. Therefore, vehicle control can be switched between a plurality of control modes corresponding to the large number of pieces of control software.

For example, in each of the first to third embodiments, the first nonvolatile memory 23 consists essentially of an electrically rewritable NOR flash memory, and the second nonvolatile memory 30 consists essentially of an electrically rewritable NAND flash memory. The NOR flash memory is designed to be unsuitable to increase of its storage capacity (its packaging density), but designed with emphasis on improving their high-speed access performance.

In contrast, the NAND flash memory is designed to be unsuitable to increasing its high-speed access performance, but designed with emphasis on increasing its storage capacity (its packaging density).

Accordingly, as described above, at least one ECU 10 can execute high-speed processing on the NOR flash memory, and can store a large number of pieces of control software meeting various types of vehicles in the NAND flash memory to switch any one of the large number of pieces of control software.

In each of the first to third embodiment, as the second nonvolatile memory 30 (30A, 30B), a mask ROM (Read Only Memory), or an electrically rewritable nonvolatile memory can be used. Use of a mask ROM as the second nonvolatile memory 30 (30A, 30B) allows the cost of each ECU 10 to be kept low. Use of an electrically readable nonvolatile memory as the second nonvolatile memory 30 (30A, 30B) permits a plurality of pieces of control software stored in the second nonvolatile memory 30 (30A, 30B) to be easily updated to their new versions.

In each of the first to third embodiment, at least one ECU 10 is operative to receive memory rewriting instructions sent from the external device 3 through the interface 9, the CAN 11, and the like. The memory rewriting instructions are designed to cause the CPU 21 to execute control-software writing operations into the internal nonvolatile memory 23 or into the external nonvolatile memory 30 (30A, 30B). The present invention is however not limited to the structure.

Specifically, at least one ECU 10 can be operative to receive:

the memory rewriting instructions sent from a tool prepared at each of service centers and the like and designed specifically for sending the memory rewriting instructions to the at least one ECU 10 via the CAN 11 and the like or the memory rewriting instructions sent from an operating unit electrically connected to the CPU 21; this operating unit allows an occupant to manually manipulate it to input the memory rewriting instructions to the CPU 21.

In the former modification, it is true that a tool designed specifically for sending the memory rewriting instructions to the at least one ECU 10 via the CAN 11 and the like. However, because it is unnecessary to store therein pieces of control software to be transferred to the at least one ECU 10, at least one ECU 10 can prevent pieces of control software meeting various types of vehicles from being prepared in the tool prepared at each of service centers and the like. This makes it simple to execute control software writing operations into the internal nonvolatile memory 23.

In each of the first to third embodiments, the CPU 21 of the microcomputer 20 of at least one ECU 10 is programmed to write a piece of control software into the internal nonvolatile memory 23 of the microcomputer 20, but the present invention is not limited to the structure. Specifically, in order to transfer a piece of control software from the external nonvolatile memory 30 to the internal nonvolatile memory 23 of the microcomputer 20 of at least one ECU 10, the CPU 21 of the microcomputer 20 of another ECU 10 can be programmed to:

read out the piece of control software from the external nonvolatile memory 30 of the microcomputer 20 of the at least one ECU 10; and write the readout piece of control software into the internal nonvolatile memory 23 of the microcomputer 20 of the at least one ECU 10.

In each of the first to third embodiments, as the first nonvolatile memory, an electrically rewritable nonvolatile memory is used, but the present invention is not limited to the structure. Specifically, as the first nonvolatile memory, a nonvolatile memory that is physically rewritable, for example, magnetically rewritable, can be used.

In each of the first to third embodiments, it is important to note that, while the present invention has been and will continue to be described in the context of each of fully functional computers, such as the ECUs 10. In the present invention, however, the elements provided in each of the ECUs 10 can be implemented as dedicated hardware devices, such as custom LSI (Large-Scale Integration) circuits.

Moreover, those skilled in the art will appreciate that the present invention is capable of being distributed as program products in a variety of forms. It is also important to note that the present invention applies equally regardless of the particular type of signal bearing media used to actually carry out the distribution. Examples of suitable signal bearing media include recordable type media such as CD-ROMs and DVD-ROMs, and transmission type media such as digital and analog communications links.

While there has been described what is at present considered to be the embodiments and modifications of the present invention, it will be understood that various modifications which are not described yet may be made therein, and it is intended to cover in the appended claims all such modifications as fall within the true spirit and scope of the invention.

What is claimed is:

1. A vehicle control system installed in a vehicle and including a computer integrated with a first nonvolatile memory that is rewritable, the vehicle control system comprising:

a second nonvolatile memory storing therein software, the software allowing the computer to execute an at least part of vehicle control, and a writing unit accessible to the first and second nonvolatile memories and configured to:

read out the software from the second nonvolatile memory at a given time; and write the readout software into the first nonvolatile memory;

wherein the second nonvolatile memory is designed to be writable;

wherein, when receiving an instruction and a writing-target piece of additional software from an external device, the writing-target piece of software allowing the computer to execute an at least part of vehicle control, the writing unit is configured to:

write the writing-target piece of additional software into the second nonvolatile memory as a piece of the software stored beforehand therein;

determine whether the writing of the writing-target piece of additional software into the second nonvolatile memory is normally completed;

read out the writing-target piece of additional software stored in the second nonvolatile memory therefrom after when it is determined that the writing of the writing-target piece of additional software into the second nonvolatile memory is normally completed; and write the readout writing-target piece of additional software into the first nonvolatile memory;

wherein a piece of software is stored in the first nonvolatile memory so that the piece of software allows the computer to execute an at least part of the vehicle control, and, if it is determined that the writing of the writing-target piece of additional software into the second nonvolatile memory is abnormally completed, the writing unit is configured to:

determine whether the writing-target piece of additional software is identical in type to the piece of software stored in the first nonvolatile memory;

read out the piece of software stored in the first nonvolatile memory therefrom if it is determined that the writing-target piece of additional software is identical in type to the piece of software stored in the first nonvolatile memory; and write the readout piece of software into the second nonvolatile memory.

\* \* \* \* \*